US011658374B2

(12) United States Patent
Yook et al.

(10) Patent No.: US 11,658,374 B2
(45) Date of Patent: May 23, 2023

(54) QUASI-COAXIAL TRANSMISSION LINE, SEMICONDUCTOR PACKAGE INCLUDING THE SAME, AND METHOD OF MANUFACTURING THE SAME

(71) Applicant: KOREA ELECTRONICS TECHNOLOGY INSTITUTE, Seongnam-si (KR)

(72) Inventors: Jong Min Yook, Seongnam-si (KR); Jun Chul Kim, Seongnam-si (KR); Dong Su Kim, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 308 days.

(21) Appl. No.: 15/930,404

(22) Filed: May 12, 2020

(65) Prior Publication Data
US 2020/0381797 A1 Dec. 3, 2020

(30) Foreign Application Priority Data
May 31, 2019 (KR) ......................... 10-2019-0064761

(51) Int. Cl.
*H04B 17/00* (2015.01)
*H01P 3/06* (2006.01)
*H01P 11/00* (2006.01)
*H01L 23/66* (2006.01)

(52) U.S. Cl.
CPC ................ *H01P 3/06* (2013.01); *H01L 23/66* (2013.01); *H01P 11/005* (2013.01); *H01L 2223/6627* (2013.01)

(58) Field of Classification Search
CPC ..... H04L 1/20; H04L 1/24; H01P 3/06; H01P 11/005; H05K 1/162; H05G 4/38
USPC .......................................... 375/224; 257/664
See application file for complete search history.

(56) References Cited

U.S. PATENT DOCUMENTS

| | | | |
|---|---|---|---|
| 2008/0246562 A1* | 10/2008 | Sherrer ................. | H01P 11/005 333/260 |
| 2011/0095435 A1 | 4/2011 | Volant et al. | |
| 2014/0015726 A1* | 1/2014 | Christie ................... | H01Q 1/50 343/790 |
| 2015/0270990 A1* | 9/2015 | Chiu ....................... | H04B 1/18 455/575.5 |
| 2020/0388969 A1* | 12/2020 | Okanami ............ | H01R 12/722 |

* cited by examiner

*Primary Examiner* — Khai Tran
(74) *Attorney, Agent, or Firm* — Hauptman Ham, LLP

(57) ABSTRACT

A quasi-coaxial transmission line, a semiconductor package including the same and a method of manufacturing the same are disclosed. The quasi-coaxial transmission line includes a core, which is formed through an upper surface and a lower surface of a base substrate so as to transmit an electrical signal, and a shield, which is spaced apart from the core and which coaxially surrounds a side surface of the core, at least a portion of the shield being removed so as to form an open portion. The quasi-coaxial transmission line is capable of preventing distortion of an electrical signal at a portion thereof that is connected to an external circuit board and to reduce an area of a semiconductor package including the quasi-coaxial transmission line.

10 Claims, 18 Drawing Sheets

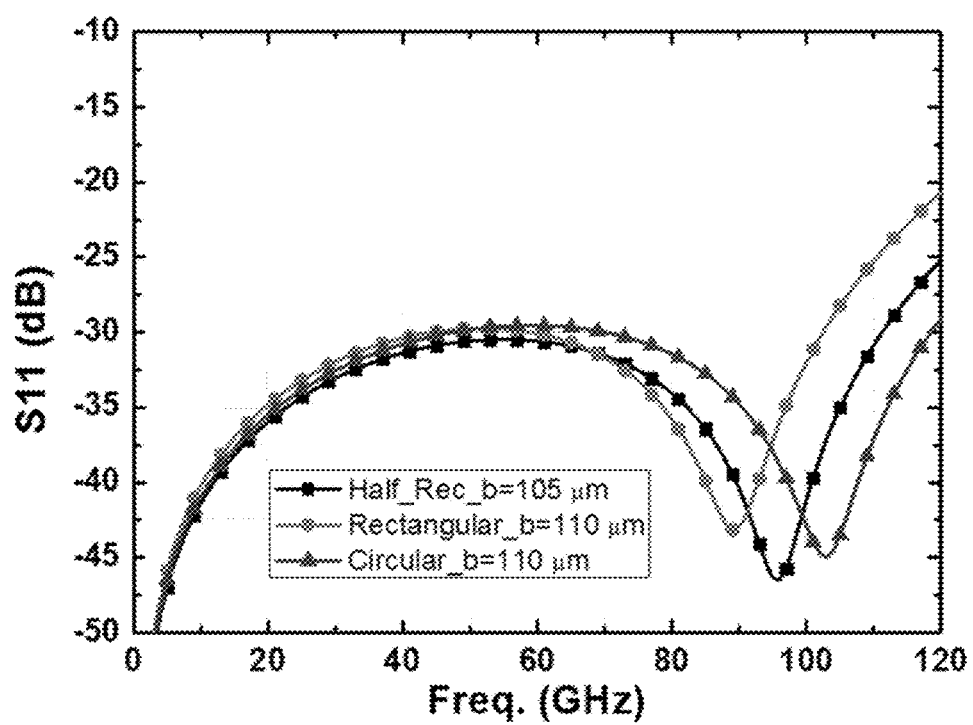

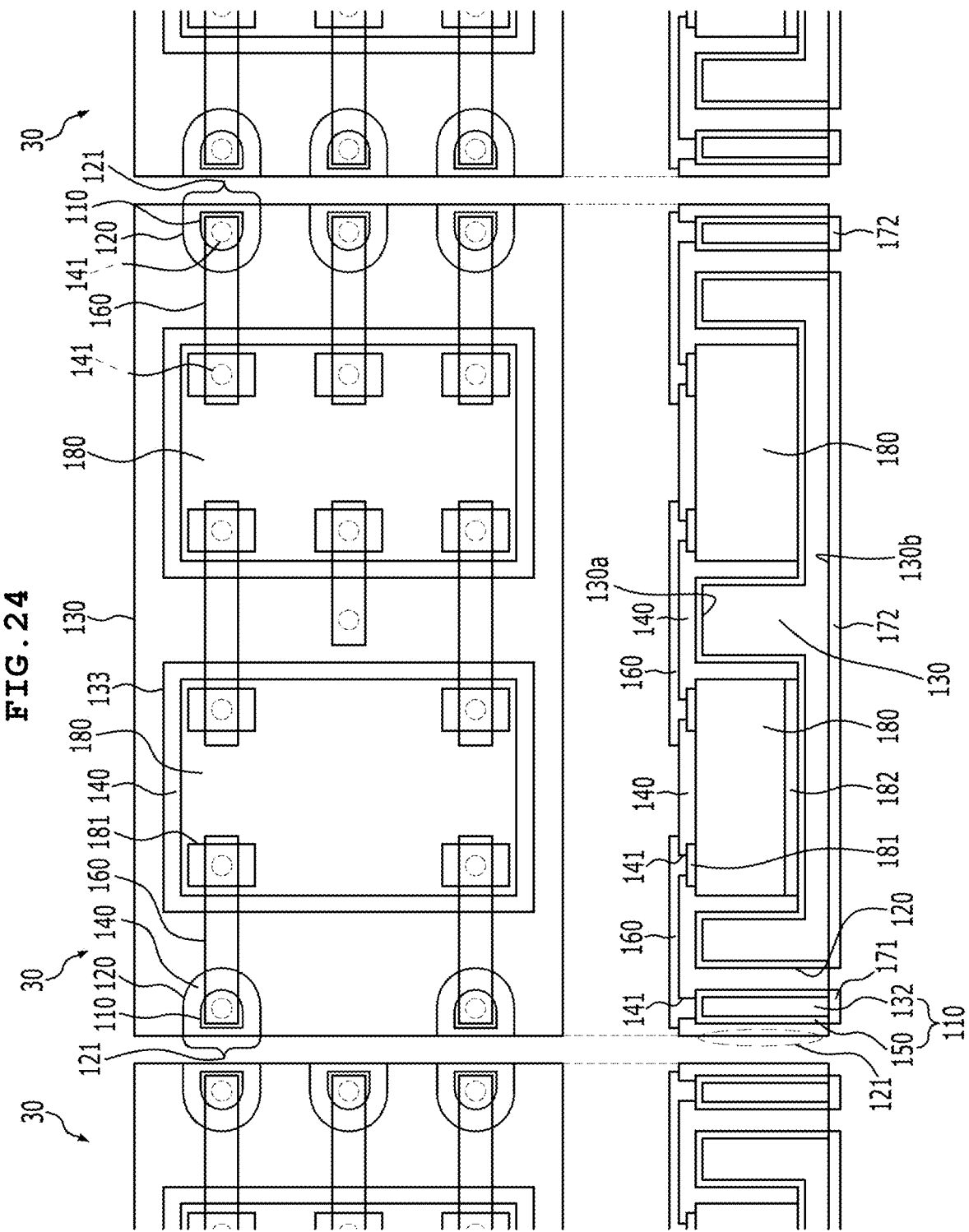

QUASI-COAXIAL TRANSMISSION LINE, SEMICONDUCTOR PACKAGE INCLUDING THE SAME, AND METHOD OF MANUFACTURING THE SAME

CROSS REFERENCE TO RELATED APPLICATION

The present application claims priority to Korean Patent Application No. 10-2019-0064761, filed May 31, 2019, the entire contents of which is incorporated herein for all purposes by this reference.

BACKGROUND OF THE INVENTION

Field of the Invention

The present invention relates to a quasi-coaxial transmission line, a semiconductor package including the same, and a method of manufacturing the same.

Description of the Related Art

With the development of communication technology, a frequency range of 5 GHz has come to be used in communication services, and research into communication service in a high frequency range of 30 GHz is currently being conducted. In a high frequency range, there is a problem in that loss or distortion of a signal occurs in a transmission line of an electrical circuit itself. For example, in a conventional through-silicon via (TSV), there is a problem in that loss or distortion of an electrical signal occurs during a procedure of transmitting an electrical signal in a high frequency range. Furthermore, it is difficult to downsize a passive device such as a filter in a high frequency range due to loss in a transmission line.

Although a packaging technology using a laminate substrate has been extensively used, it is difficult to apply the technology to a semiconductor package in a high frequency range due to the low degree of integration and difficulty in realizing precise wiring. Furthermore, because there are requirements to downsize a semiconductor package and increase the degree of integration in response to the recent trend toward reduced size of electronic devices, there is a need for a semiconductor package structure capable of protecting an electrical signal and downsizing the semiconductor package. Furthermore, there is a need for a connection structure capable of transmitting an electrical signal in a high frequency range with as littin change as possible in a procedure of connecting the semiconductor package to an external circuit.

RELATED ART DOCUMENT

Patent Document 1

U.S. Patent Application Publication No. 2011-0095435 A1

SUMMARY OF THE INVENTION

Therefore, the present invention has been made in view of the above problems, and it is an object of the present invention to provide a quasi-coaxial transmission line capable of minimizing the loss of an electrical signal in a millimeter-wave frequency range, a semiconductor package including the quasi-coaxial transmission line, and a method of manufacturing the quasi-coaxial transmission line and the semiconductor package.

In accordance with the present invention, the above and other objects can be accomplished by the provision of a quasi-coaxial transmission line used in a semiconductor package including a core, which is formed through an upper surface and a lower surface of a base substrate so as to transmit an electrical signal, and a shield, which is spaced apart from the core and which coaxially surrounds a side surface of the core, at least a portion of the shield being removed so as to form an open portion.

Each of the core and the shield may be made of a material having electrical conductivity, wherein the core is formed by forming a conductive layer on a surface of a pole, which is formed using a portion of the base substrate, and the shield is formed by forming a conductive layer on a surface of the base substrate that faces a side surface of the core.

The thickness of the conductive layer formed on the surface of the pole may be determined by a skin depth, which is calculated based on a frequency of an electrical signal passing through the core.

When the quasi-coaxial transmission line is connected to an external circuit board, the open portion may be formed to be open toward a path in which a signal electrode of the external circuit board is formed such that the signal electrode of the external circuit board does not overlap the shield.

The open portion may be configured so as to face a side surface of the semiconductor package.

In accordance with another aspect of the present invention, there is provided a semiconductor package including a quasi-coaxial transmission line including a base substrate having at least one reception portion therein, one or two or more semiconductor chips received in the reception portion, the quasi-coaxial transmission line, which is formed through an upper surface and a lower surface of the base substrate so as to transmit an electrical signal, an insulation layer configured to cover the base substrate, the semiconductor chip and the quasi-coaxial transmission line, and an electrode pattern configured to electrically connect the semiconductor chip to the quasi-coaxial transmission line or to electrically connect the two or more semiconductor chips to each other, wherein the quasi-coaxial transmission line includes a core, which is formed through the upper surface and the lower surface of the base substrate so as to transmit an electrical signal, and a shield, which is spaced apart from the core and which coaxially surrounds a side surface of the core, at least a portion of the shield being removed so as to form an open portion.

When the quasi-coaxial transmission line is connected to an external circuit board, the open portion may be formed to be open toward a path in which a signal electrode of the external circuit board is formed such that the signal electrode of the external circuit board does not overlap the shield.

The semiconductor package may further include a first connection pad formed at a lower end of the core so as to provide a contact for an external circuit board, and a second connection pad formed at a lower end of the shield so as to provide a contact for the external circuit board.

The semiconductor package may further include a conductive layer formed on the upper surface and a side surface of the base substrate and having electrical conductivity.

In accordance with a further aspect of the present invention, there is provided a method of manufacturing a quasi-coaxial transmission line including forming a groove-shaped cavity, which surrounds at least one core and which is open at a side surface of a base substrate, in a first surface of the base substrate, forming an insulation layer in the cavity, and removing a portion of a second surface of the base substrate to physically separate a lower end of the core from the base substrate.

The cavity may be configured so as to surround one core or two or more cores, which are spaced apart from each other, and the method may further include, after removing the portion of the second surface of the base substrate, cutting the base substrate between the one core and the cavity or between the two or more cores, which are spaced apart from each other, to form an open portion.

In accordance with yet a further aspect of the present invention, there is provided a method of manufacturing a quasi-coaxial transmission line including forming a groove-shaped cavity, which surrounds at least one pole and which is open at a side surface of a base substrate, in a first surface of the base substrate, forming a conductive layer on a surface of the pole and on a surface of the base substrate, forming an insulation layer in the cavity, and removing the conductive layer formed on a lower surface of the cavity while removing a portion of a second surface of the base substrate to separate the conductive layer formed on the pole from the conductive layer formed on an inner side surface of the cavity, thereby providing a core and a shield, which are separated from each other.

The cavity may be configured so as to surround one pole or two or more poles, which are spaced apart from each other, and the method may further include, after providing the core and the shield, cutting the base substrate between the one core and the cavity or between the two or more cores, which are spaced apart from each other, to form an open portion.

In accordance with still a further aspect of the present invention, there is provided a method of manufacturing a semiconductor package including a quasi-coaxial transmission line including forming at least one cavity surrounding one pole or two or more poles, which are spaced apart from each other, and at least one reception portion, in a first surface of a base substrate, forming a conductive layer made of a material having electrical conductivity on the first surface of the base substrate, mounting a semiconductor chip in the at least one reception portion, forming an insulation layer configured to cover the base substrate and the semiconductor chip, and forming a wiring layer, configured to form an electrode pattern for transmission of an electrical signal, on an insulation layer, removing the conductive layer formed on a lower surface of the cavity while removing a portion of a second surface of the base substrate to separate the conductive layer formed on the pole from the conductive layer formed on an inner side surface of the cavity, thereby providing a core and a shield, which are separated from each other, and cutting the base substrate between the core and the cavity or between the two or more poles, which are spaced apart from each other, to remove at least a portion of the shield, thereby providing an open portion.

The features and advantages of the present invention will be more apparent from the following detailed description with reference to the accompanying drawings.

Unless otherwise defined, all terms including technical and scientific terms used herein have the same meanings as those commonly understood by one of ordinary skill in the art to which this invention belongs. It will be further understood that terms, such as those defined in commonly used dictionaries, should be interpreted as having meanings consistent with their meaning in the context of the relevant art and the present disclosure, and are not to be interpreted in an idealized or overly formal sense unless expressly so defined herein.

BRIEF DESCRIPTION OF THE DRAWINGS

The above and other objects, features and other advantages of the present invention will be more clearly understood from the following detailed description taken in conjunction with the accompanying drawings, in which:

FIG. 8D is a graph showing the comparison in electrical characteristics between the conventional coaxial transmission line and the quasi-coaxial transmission line according to an embodiment of the present invention;

FIGS. 21, 22, 23, and 24 are views illustrating the operations of the method of manufacturing the semiconductor package including the quasi-coaxial transmission line according to an embodiment of the present invention.

DETAILED DESCRIPTION OF THE INVENTION

Figure 1:
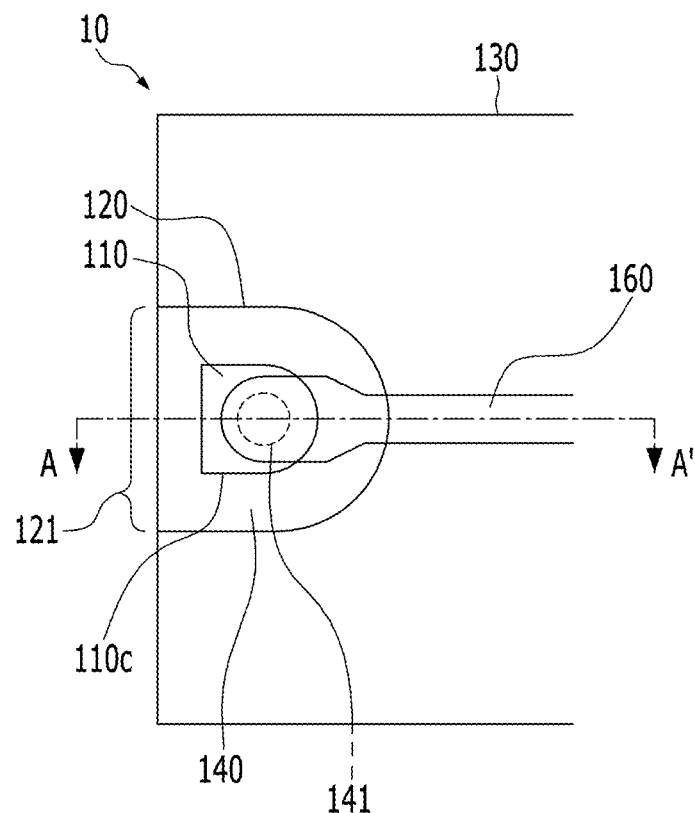
FIG. 1 is a plan view illustrating a quasi-coaxial transmission line according to an embodiment of the present invention.

The objects, specific advantages and novel features of the present invention will be apparent from the following detailed description and preferred embodiments with reference to the accompanying drawings. In the specification, when inserting reference numerals into the components in the respective drawings, although the same components are illustrated in different drawings, they are referred to using the same reference numeral as far as possible. The terms "one surface", "other surface", "first", "second", etc. are only used to distinguish one element from another, and the elements are not limited thereby. In the following description of the present invention, detailed descriptions of known functions and components incorporated herein will be omitted when the same may make the subject matter of the present invention unclear.

Hereinafter, an embodiment of the present invention will be described in detail with reference to the accompanying drawings.

Figure 2:
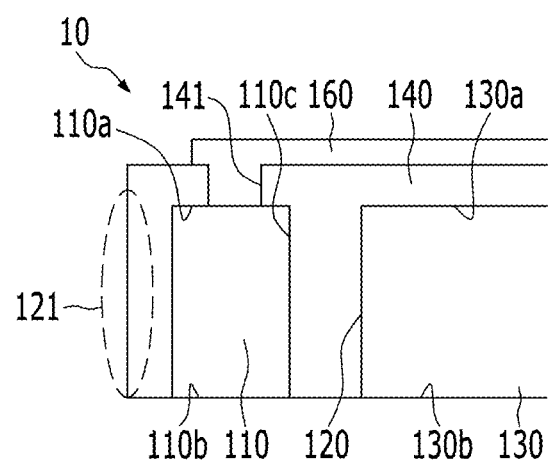
FIG. 2 is a cross-sectional view, taken along line A-A' in FIG. 1.

FIG. 1 is a plan view showing a quasi-coaxial transmission line 10 according to an embodiment of the present invention. FIG. 2 is a cross-sectional view taken along line A-A' in FIG. 1. FIGS. 1 and 2 illustrate a portion of a base substrate 130 on which the quasi-coaxial transmission line 10 is formed.

The quasi-coaxial transmission line 10 according to an embodiment of the present invention may be a transmission line included in a semiconductor package. The quasi-coaxial transmission line 10 may be formed on the substrate of a semiconductor package or a printed circuit board (PCB). The quasi-coaxial transmission line 10 may be considered to be a typical coaxial transmission line structure composed of a core and a shield, from which a portion of the shield is removed.

As illustrated in FIGS. 1 and 2, the quasi-coaxial transmission line 10 may be formed through the upper surface 130a and the lower surface 130b of the base substrate 130. The quasi-coaxial transmission line 10 according to an embodiment of the present invention may include a core 110, which is formed through the upper surface 130a and the lower surface 130b of the base substrate 130 so as to transmit an electrical signal, and a shield 120, which is spaced apart from the core 110 and coaxially surrounds the side surface 110c of the core 110. The shield 120 may have an open portion 121, which is formed by removing at least a portion of one side surface thereof.

The core 110 may be made of an electroconductive material so as to transmit an electrical signal. The core 110 may be configured to have a rectangular section, a circular section, an arched section or the like. For example, the core 110 shown in FIG. 1 has a section that is arched toward the inside of the base substrate 130. The core 110 may be configured to have a column shape, which is formed through the upper surface 130a and the lower surface 130b of the base substrate 130.

The shield 130 is made of an electroconductive material. The shield 120 may be configured so as to be coaxial with the core 110. The fact that the shield 120 is coaxial with the core 110 may mean that the distance between the shield 120 and the core 110 is constant and that the shield 120 is formed along the sectional shape of the core 110. The shield 120 may be configured to have a section that is the same as or similar to the section of the core 110. For example, the shield 120 and the core 110 shown in FIG. 1, are configured to have sections that are spaced apart from each other by a constant distance and are arched toward the inside of the base substrate 130.

The open portion 121 may be formed in one side of the shield 120. The open portion 121 is a portion that is opened by forming the remaining side surface, other than one side surface of the shield 120, or by removing the one side surface of the shield 120. In other words, the shield 120 does not surround the entire side surface 110c of the core 110, and a portion of the side surface 110c of the core 110 is electrically exposed through the open portion 121 formed in the shield 120.

As illustrated in FIGS. 1 and 2, the core 110 and the shield 120 may be formed as a portion of the base substrate 130. The base substrate 130 may be made of an electroconductive material. A portion of the base substrate 130 may be separated from the base substrate 130 so as to form the core 110, and the portion of the base substrate 130 that is separated from the core 110, may become the shield 120. In other words, the shield 120 may be the portion of the side surface of the base substrate 130 that faces the side surface 110c of the core 110. The open portion 121 of the shield 120 may be the portion that is formed by removing a portion of the side surface of the base substrate 130. In other words, the open portion 121 may be formed so as to face toward the outside of the side surface of the base substrate 130.

Figure 3:
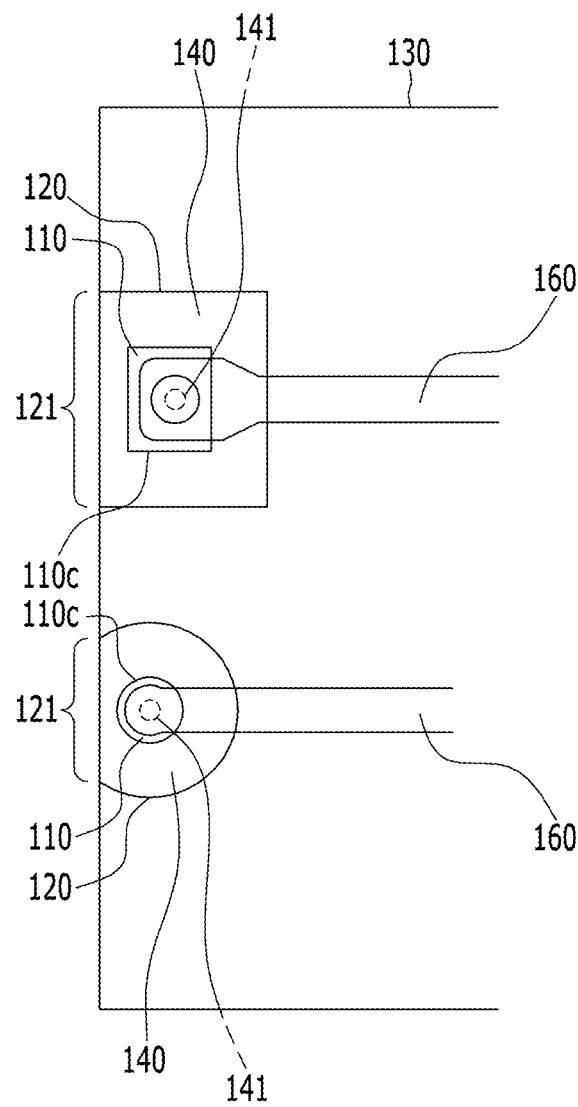
FIG. 3 is a plan view illustrating another configuration of the quasi-coaxial transmission line.

FIG. 3 is a plan view showing another shape of the quasi-coaxial transmission line 10. As illustrated in FIG. 3, the core 110 may be configured to have a rectangular section, and the shield 120 may be configured to have a rectangular section, which is open at one side thereof. Alternatively, the core 110 may be configured to have a circular section, and the shield 120 may be configured to have a circular section, which is open at a portion thereof. The sectional shapes of the core 110 and the shield 120 are not limited to those disclosed in the specification.

Referring again to FIGS. 1 and 2, an insulation layer 140 may be formed in the space between the core 110 and the shield 120. The insulation layer 140 prevents the core 110 and the shield 120 from coming into electrical contact with each other. The insulation layer 140 may physically secure the core 110 and the shield 120. The insulation layer 140 may be formed so as to cover the upper surface 130a of the base substrate 130, the upper surface 110a of the core 110, and the upper surface of the shield 120. The insulation layer 140 may include a via 141, through which the upper surface of the core 110 is exposed. An electrode pattern 160 may be formed on the insulation layer 140. The electrode pattern 160 may be connected to the core 110 via the via 141 so as to transmit an electrical signal to the core 110. The electric signal may be transmitted to the upper surface 110a of the core 110 along the electrode pattern 160, and may be output to the lower surface 110b of the core 110.

The core 110 and the shield 120 may be made of metal, such as copper (Cu), aluminum (Al) or silver (Ag), an alloy including the metal, a polymer compound having electrical conductivity or another material having electrical conductivity. The core 110 and the shield 120 may be formed in a manner of removing a portion of the base substrate 130 and coupling the quasi-coaxial transmission line 10 composed of the core 110 and the shield 120 to the location from which the base substrate 130 was removed. Alternatively, when the base substrate 130 is made of an electroconductive material, the core 110 and the shield 120 may be formed using a portion of the base substrate 130.

Figure 4:
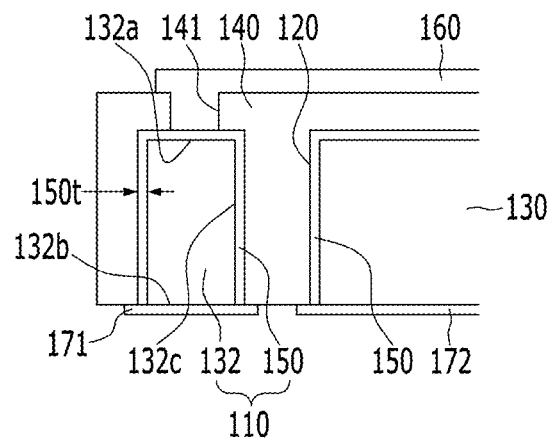
FIG. 4 is a cross-sectional view of another configuration of the quasi-coaxial transmission line, taken along line A-A' in FIG. 1.

FIG. 4 is a cross-sectional view taken along line A-A' in FIG. 1.

The base substrate 130 may be made of a material having little or no electrical conductivity. For example, the base substrate 130 may be made of a silicone (Si) material. In this case, the core 110 and the shield 120 may be formed in a manner of removing a portion of the base substrate 130 and coupling the quasi-coaxial transmission line composed of the core 110 and the shield 120 to location from which the base substrate 130 was removed. Alternatively, the core 110 may be formed by forming a conductive layer 150 on the surface of a pole 132 formed by a portion of the base substrate 130, and the shield 120 may be formed by forming a conductive layer 150 on the surface of the base substrate 130 that faces the side surface of the core 110. The surfaces of the pole 132 may include an upper surface 132a and a side surface 132c.

As illustrated in FIG. 4, the core 110 may include the pole 132, formed by a portion of the base substrate 130, and the conductive layer 150, formed on the surface of the pole 132 and having electrical conductivity. Since the pole 132 is a portion of the base substrate 130 and is separated from the base substrate 130, the pole 132 may be made of the same material as the base substrate 130. The conductive layer 150 may be formed on the surface of the pole 132. The conductive layer 150 may be made of metal having electrical conductivity, such as copper (Cu), aluminum (Al) or silver (Ag), an alloy including the metal, a polymer compound having electrical conductivity or another material having electrical conductivity. The conductive layer 150 may be formed on the upper surface 132a and the side surface 132c of the pole 132. In other words, the core 110 may be configured to have a column structure in which the pole 132 is positioned at the center and the conductive layer 150 is formed on the surface of the pole 132. When an electrical signal is input to the conductive layer 150 formed on the upper surface 132a of the pole 132, the electrical signal may be transmitted to the lower end of the side surface 132c of the pole 132 along the conductive layer 150.

The thickness 150t of the conductive layer 150 may be designed differently according to the frequency of an electrical signal that passes through the core 110. The thickness 150t of the conductive layer 150 formed on the surface of the pole 132 may be determined by a skin depth, which is calculated based on the frequency of the electrical signal passing through the core 110. Because an electrical signal in a high frequency range is affected by the skin effect, it is possible to calculate the skin depth of the electrical signal in a given high frequency range. Because the skin depth decreases as the frequency increases, the thickness 150t of the conductive layer 150 may decrease as the frequency of an electrical signal increases. For example, the thickness 150t of the conductive layer 150 may be several micrometers.

The shield 120 may be formed by forming the conductive layer 150 on the surface of the base substrate 130 that faces the core 110. In other words, the shield 120 may be the portion of the conductive layer 150 formed on the base substrate 130 that surrounds the core 110 so as to face the core 110. The conductive layer 150 constituting the shield 120 and the conductive layer 150 formed on the surface of the pole 132 may have the same thickness. The conductive layer 150 formed on the upper surface of the base substrate 130 may be covered by the insulation layer 140, and the conductive layer 150 may serve as a ground for the electrode pattern 160 formed on the insulation layer 140.

The quasi-coaxial transmission line 10 according to an embodiment of the present invention may further include a first connection pad 171, formed on the lower end of the core 110 and serving as a contact for an external circuit board 30, and a second connection pad 172, formed on the lower end of the shield 120 and serving as a contact for the external circuit board 30. As illustrated in FIG. 4, the first connection pad 171 may be formed so as to be connected to the conductive layer 150 of the core 110. In other words, the first connection pad 171 may be connected both to the lower surface 132b of the pole 132 and to the conductive layer 150 of the lower end of the side surface 132c of the pole 132. The second connection pad 172 may be formed so as to be connected to the conductive layer 150 formed on the base substrate 130 that faces the core 110. The second connection pad 172 may be formed so as to surround the first connection pad 171 and to match the shape of the shield 120, but may not be formed at the open portion 121 of the shield 120. When the shield 120 is, for example, arched toward the inside of the base substrate 130, as illustrated in FIG. 1, at least a portion of the second connection pad 172 may be formed so as to be arched toward the inside of the base substrate 130. When the second connection pad 172 is configured so as to surround the first connection pad 171 in conjunction with the shield 120, it is possible to prevent distortion of an electrical signal passing through the first connection pad 171. Distortion of an electrical signal means damage to the electrical signal attributable to various causes, such as parasitic inductance, parasitic capacitance, crosstalk, insertion loss and return loss.

Figure 5:
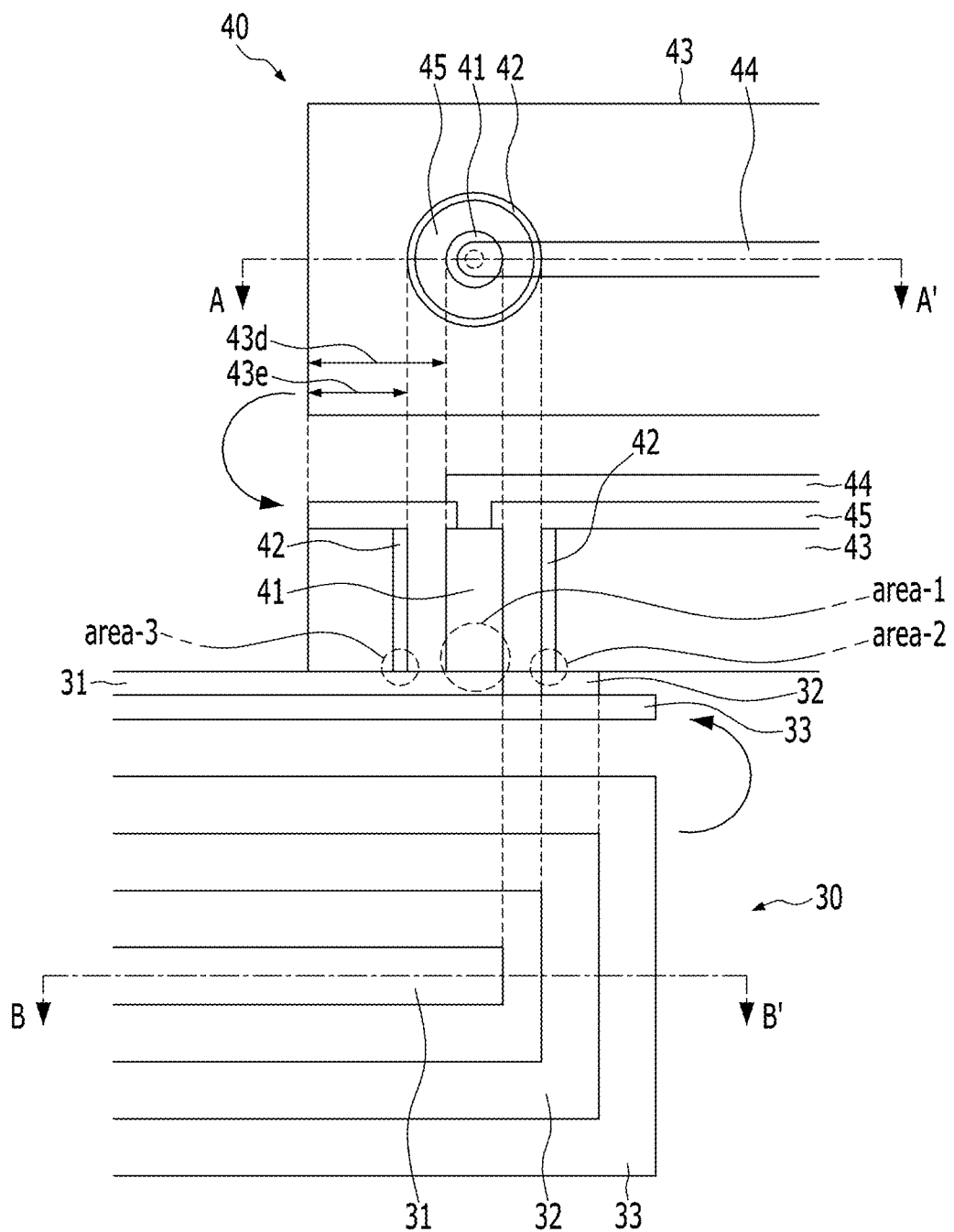
FIGS. 5 and 6 are views illustrating the connections between conventional coaxial transmission lines and external circuit boards.
Figure 6:
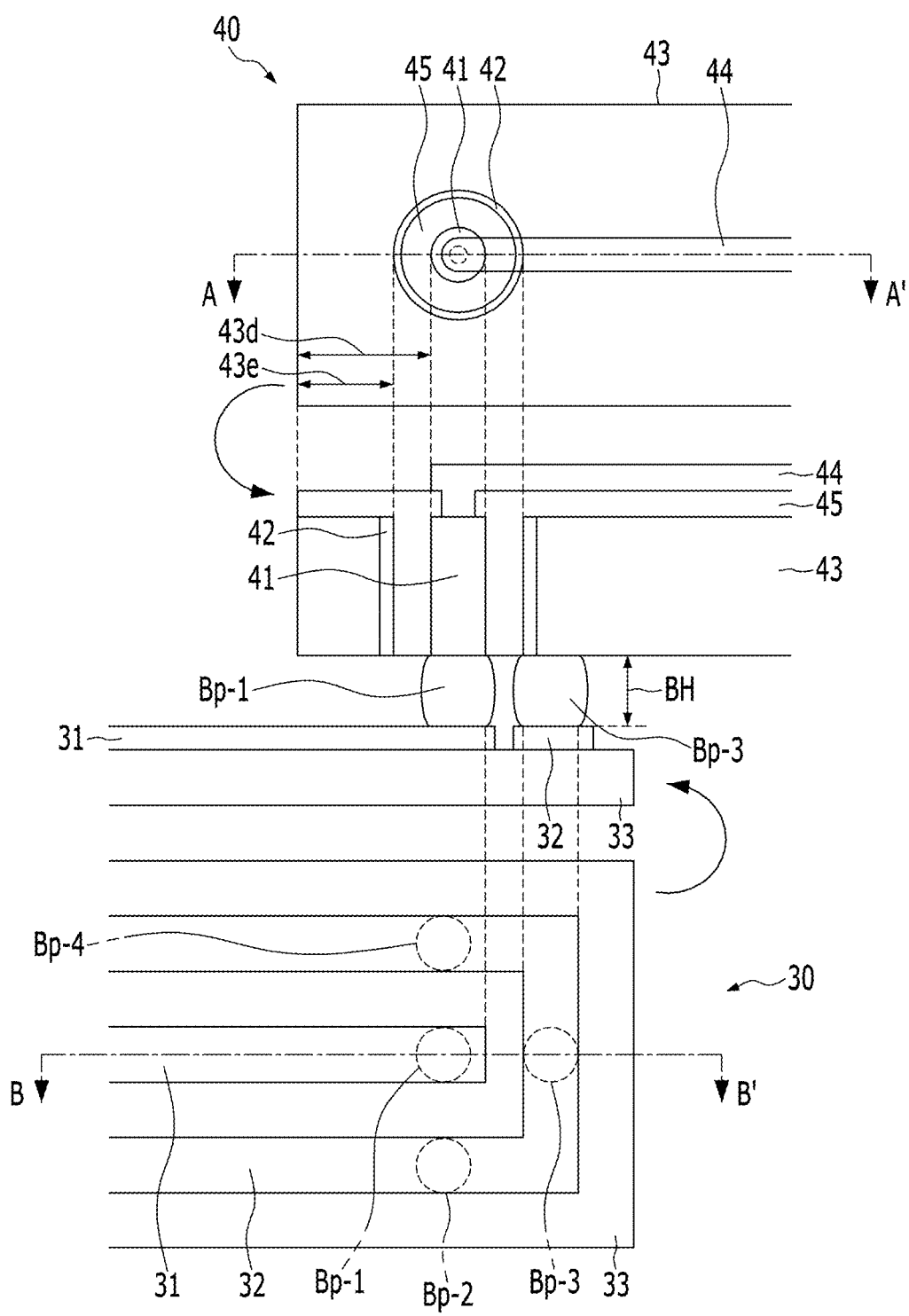
Figure 7:
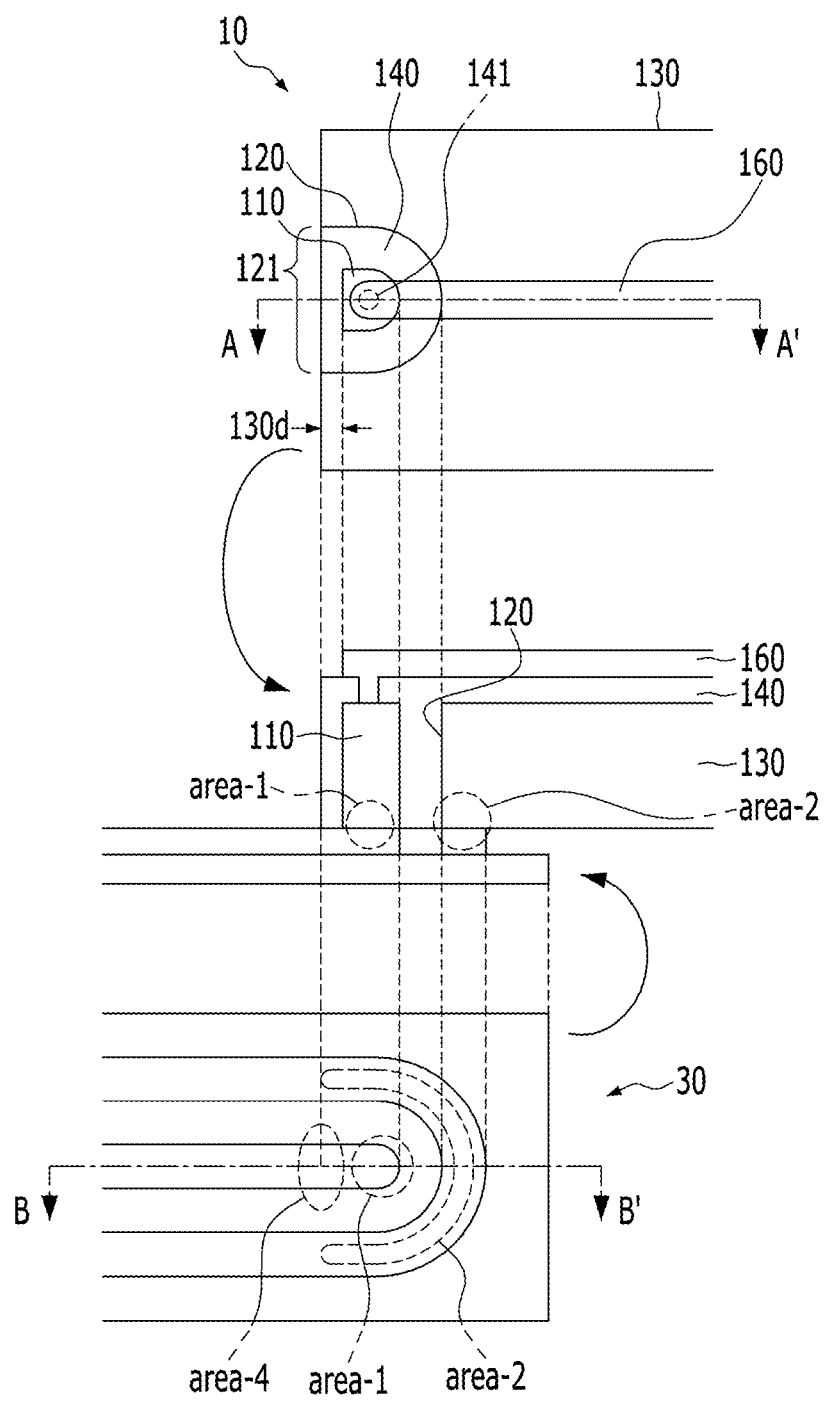
FIG. 7 is a view illustrating the connection between the quasi-coaxial transmission line according to an embodiment of the present invention and an external circuit board.

FIGS. 5 and 6 are views illustrating the connections between the conventional coaxial transmission line 40 and an external circuit board 30. FIG. 7 is a view illustrating the connection between the quasi-coaxial transmission line 10 according to an embodiment of the present invention and an external circuit board 30.

FIG. 5 illustrates a plan view of the conventional coaxial transmission line 40 and a plan view of the external circuit board 30, and illustrates a cross-sectional view showing the connection between the conventional coaxial transmission line 40 and the external circuit board 30 on the basis of a cross-sectional view of the conventional coaxial transmission line 40 taken along line A-A' and a cross-sectional view of the external circuit board 30 taken along line B-B'. As illustrated in FIG. 5, the conventional coaxial transmission line 40 is configured such that a core 41 and a shield 42 are formed through a base substrate 42. An insulation layer 45 may be formed between the core 41 and the shield 42, and an electrode pattern 44 may be formed on the insulation layer 45 so as to be connected to the core 41. The external circuit board 30 may be configured such that a signal electrode 31 is formed on one surface of a substrate 33 and a ground electrode 32 is configured so as to surround the signal electrode 31 in the state of being spaced apart from the signal electrode 31. When the conventional coaxial transmission line 40 is connected to the external circuit board 30, the lower portion of the core 41 is brought into contact with the signal electrode 31 in an area (area-1), and the shield 120 is brought into contact with the ground electrode 32 in an area (area-2). Here, because the shield 42 of the conventional coaxial transmission line 40 surrounds the entire side surface of the core 41, there is a shorted area (area-3) at which the signal electrode 31 is in contact with the shield 42. When the shorted area (area-3) exists, an electrical signal, which is sequentially transmitted to the electrode pattern 44, the core 41 and the signal electrode 31, is transmitted to the shield 42 or the ground electrode 32 via the shorted area (area-3), thereby causing a problem of distortion of the electrical signal.

FIG. 6 illustrates a plan view of the conventional coaxial transmission line 40 and a plan view of the external circuit board 30, and illustrates a cross-sectional view showing the connection between the conventional coaxial transmission line 40 and the external circuit board 30 via bumps Bp on the basis of a cross-sectional view of the conventional coaxial transmission line 40 taken along line A-A' and a cross-sectional view of the external circuit board 30 taken along line B-B'. As illustrated in FIG. 6, the bumps Bp are formed between the conventional coaxial transmission line 40 and the external circuit board 30 so as to prevent creation of the shorted area (area-3) shown in FIG. 5. The bumps Bp may cause the conventional coaxial transmission line 40 to be spaced apart from the external circuit board 30 by the height BH of the bumps Bp. Consequently, because the shield 42 of the conventional coaxial transmission line 40 is spaced apart from the signal electrode 31 of the external circuit board 30, there is no shorted area (see the shorted area (area-3) in FIG. 5). Generally, the bumps may be solder balls, and may be configured so as to connect the shield 42 only to a portion of the ground electrode 32.

For example, as indicated by the dotted lines in the plan view of the external circuit board 30 in FIG. 6, the bumps Bp may include a first bump Bp-1, disposed between the core 41 and the signal electrode 31, and a second bump Bp-2, a third bump Bp-3, and a fourth bump Bp-4, which are disposed between the shield 42 and the ground electrode 32 so as to be spaced apart from one another. In this case, when an electrical signal in a high frequency range passes through the first bump Bp-1 during transmission to the signal electrode 31 through the core 41, distortion of the electrical signal may occur. In other words, the conventional coaxial transmission line 40 has a problem in that distortion of the electrical signal may occur when the coaxial transmission line 40 is connected to the external circuit board 30.

FIG. 7 illustrates a plan view of the quasi-coaxial transmission line 10 according to an embodiment of the present invention and a plan view of the external circuit board 30, and illustrates a cross-sectional view showing the connection between the quasi-coaxial transmission line 10 and the external circuit board 30 on the basis of a cross-sectional view of the quasi-coaxial transmission line 10 taken along line A-A' and a cross-sectional view of the external circuit board 30 taken along line B-B'. The shield 120 of the quasi-coaxial transmission line 10 is provided in one side surface thereof with the open portion 121. As illustrated in FIG. 7, the open portion 121 may be formed, for example, so as to face toward the outside of the side surface of the semiconductor package or the base substrate 130. In other words, the open portion 121 may be formed to be open toward the path along which the signal electrode 31 of the external circuit board 30 is formed such that the signal electrode 31 of the external circuit board 30 does not overlap the shield 120 when the quasi-coaxial transmission line 10 is connected to the external circuit board 30.

As illustrated in FIG. 7, the quasi-coaxial transmission line 10 according to an embodiment of the present invention has no shorted area (see the area (area-3) in FIG. 5) at which the signal electrode 31 of the external circuit board 30 is brought into contact with the shield 120 of the quasi-coaxial transmission line 10 when the quasi-coaxial transmission line 10 is connected to the external circuit board 30. As illustrated by the dotted lines in FIG. 7, since the open portion 121 of the shield 120 is formed to be open toward the path along which the signal electrode 31 of the external circuit board 30 is formed, the shield 120 is not in contact with the signal electrode 31 (area-4). Accordingly, there is no need for the bumps for connection between the quasi-coaxial transmission line 10 and the external circuit board 30 (see Bp in FIG. 6). As illustrated by the dotted line in FIG. 7, the core 110 of the quasi-coaxial transmission line 10 is in contact with the signal electrode 31 of the external circuit board 30 at an area (area-1), and the entire shield 120 of the quasi-coaxial transmission line 10 is in contact with the ground electrode 32 of the external circuit board 30 at an area (area-2). Consequently, the connection between the quasi-coaxial transmission line 10 and the external circuit board 30 enables the shield 120 and the ground electrode 32 to continuously protect the core 110 and the signal electrode 31 unlike the conventional coaxial transmission lines 40.

Furthermore, the quasi-coaxial transmission line 10 according to an embodiment of the present invention is capable of minimizing the area that the quasi-coaxial transmission line 10 occupies on the base substrate 130. In other words, when the quasi-coaxial transmission line 10 according to an embodiment of the present invention is applied to a semiconductor package, it is possible to minimize the area of the semiconductor package. When comparing the distance 43d between the core 41 of the conventional coaxial transmission line 40 and the side surface of the base substrate 130 shown in FIGS. 5 and 6 with the distance 130d between the core of the quasi-coaxial transmission line 10 and the side surface of the base substrate 130 shown in FIG. 7, it is noted that the distance 130d between the core 110 of the quasi-coaxial transmission line 10 and the side surface of the base substrate 130 is shorter than the distance 43d. Since the quasi-coaxial transmission line 10 is configured such that a portion of the side surface of the shield 120 is removed, the open portion 121 of the shield 120 may become the side surface of the base substrate 130. Consequently, the quasi-coaxial transmission line 10 is capable of reducing the size of a semiconductor package by the distance 43e between the shield 42 of the conventional coaxial transmission line 40 and the side surface of the base substrate 42 shown in FIGS. 5 and 6.

Figure 8A:
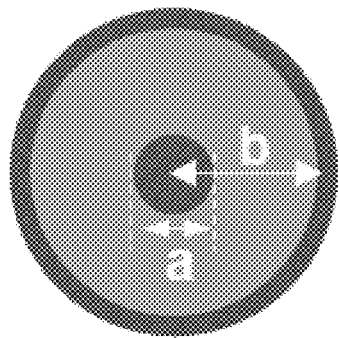
FIG. 8A is a view illustrating a coaxial transmission line having a circular section.
Figure 8B:
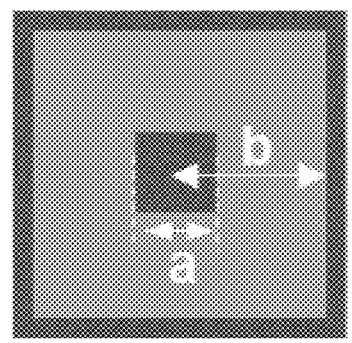
FIG. 8B is a view illustrating a coaxial transmission line having a rectangular section.
Figure 8C:
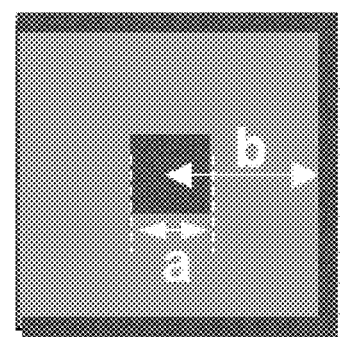
FIG. 8C is a view illustrating the quasi-coaxial transmission line having a rectangular section, in which one side surface of the shield is open.

FIG. 8A is a view illustrating a coaxial transmission line having a circular section. FIG. 8B is a view illustrating a coaxial transmission line having a rectangular section. FIG. 8C is a view illustrating the quasi-coaxial transmission line having a rectangular section, in which one side surface of the shield is open. FIG. 8D is a graph showing the comparison in electrical characteristics between the conventional coaxial transmission line and the quasi-coaxial transmission line according to an embodiment of the present invention.

Specifically, FIG. 8D is a graph showing the comparison in s-parameter characteristic among a coaxial transmission line having a circular section (see FIG. 8A), a coaxial transmission line having a rectangular section (see FIG. 8B) and the quasi-coaxial transmission line 10 having a rectangular section, in which one side surface of the shield 120 is open (see FIG. 8C). The resonant frequency is about 90 GHz in the case of the coaxial-transmission line having the circular section, about 105 GHz in the case of the coaxial-transmission line having the rectangular section and about 95 GHz in the case of the coaxial-transmission line having the rectangular section and the one surface of the shield being open (Half-Rec). It is noted that the open portion formed in one side surface of the shield does not cause a rapid change in resonant frequency and the value of S11(dB) is not considerably lowered overall. Accordingly, it will be appreciated that there is almost no change in electrical characteristics even when the quasi-coaxial transmission line 10 according to an embodiment of the present invention is adopted, compared to the conventional coaxial transmission lines.

Figure 9A:
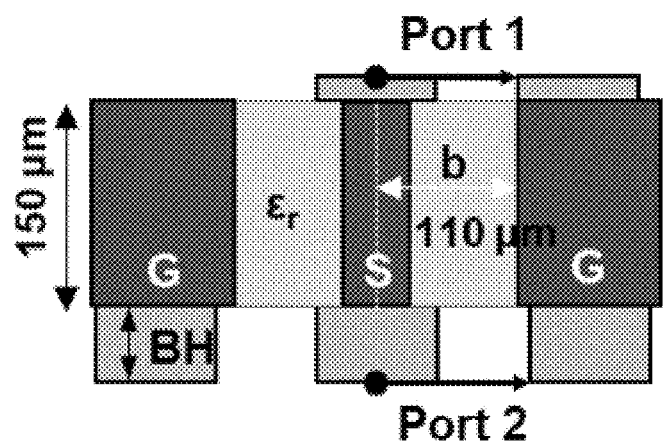
FIG. 9A is a view illustrating a height of the bump of the conventional coaxial transmission line.
Figure 9B:
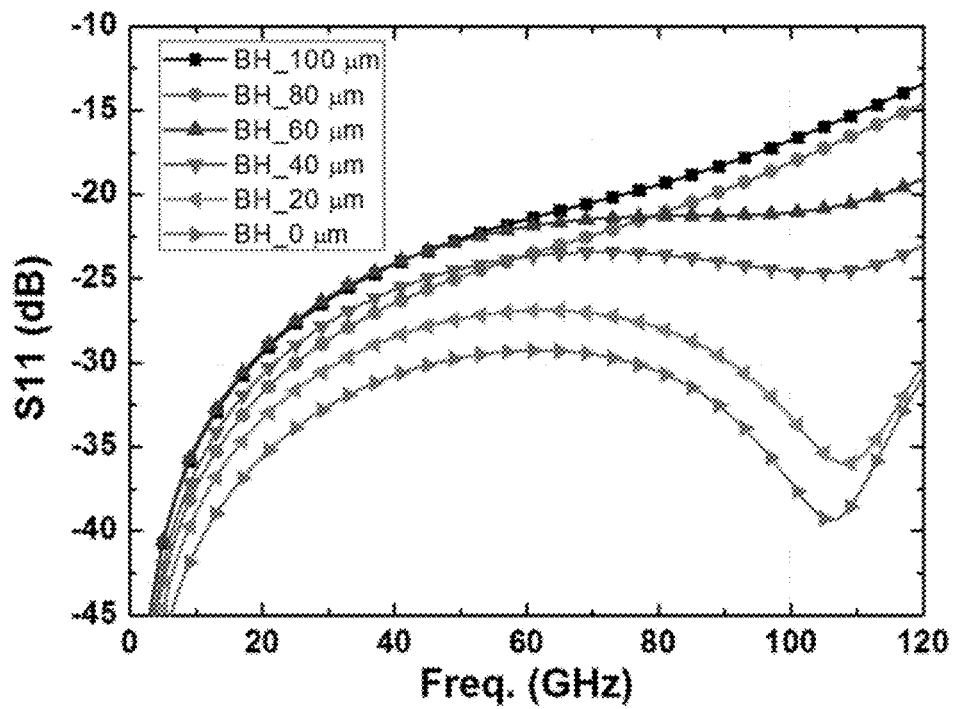
FIG. 9B is a graph showing the comparison in electrical characteristics of the conventional coaxial transmission line according to the height of the bump.

FIG. 9A is a view illustrating a height of the bump of the conventional coaxial transmission line. FIG. 9B is a graph showing the comparison in electrical characteristics of the conventional coaxial transmission line according to the height of the bump.

Specifically, near 108 GHz in the case of no bump (BH_0) and the resonant frequency resides FIG. 9B is a graph showing the comparison in an s-parameter characteristic of the coaxial transmission line when the height (see BH FIG. 9A) of the bump (see Bp in FIG. 6) is 0 μm, 20 μm, 40 μm, 60 μm, 80 μm and 100 μm. As illustrated in FIG. 9B, it is noted that electrical characteristics are maintained from the fact that the resonant frequency resides near 110 GHz in the case of a low bump (BH_20). However, the graph shows that the resonant frequency does not appear and the value of S11 increases in proportion to the frequency when the bump is high (BH_40, BH_60, BH_80, BH_100). In other words, the conventional coaxial transmission line 40 has a problem in that distortion of an electrical signal occurs depending on the height of the bump when the coaxial transmission line 40 is connected to the external circuit board 30 via the bump. In contrast, since the quasi-coaxial transmission line 10 according to an embodiment of the present invention (see FIG. 7) is configured such that the open portion 121 is present at the shield 120, and is formed toward the direction in which the signal electrode 31 of the external circuit board 30 extends, a problem whereby a short circuit occurs between the shield 120 and the signal electrode 31 of the external circuit board 30 is solved, and thus there is no need for a bump.

Figure 10:
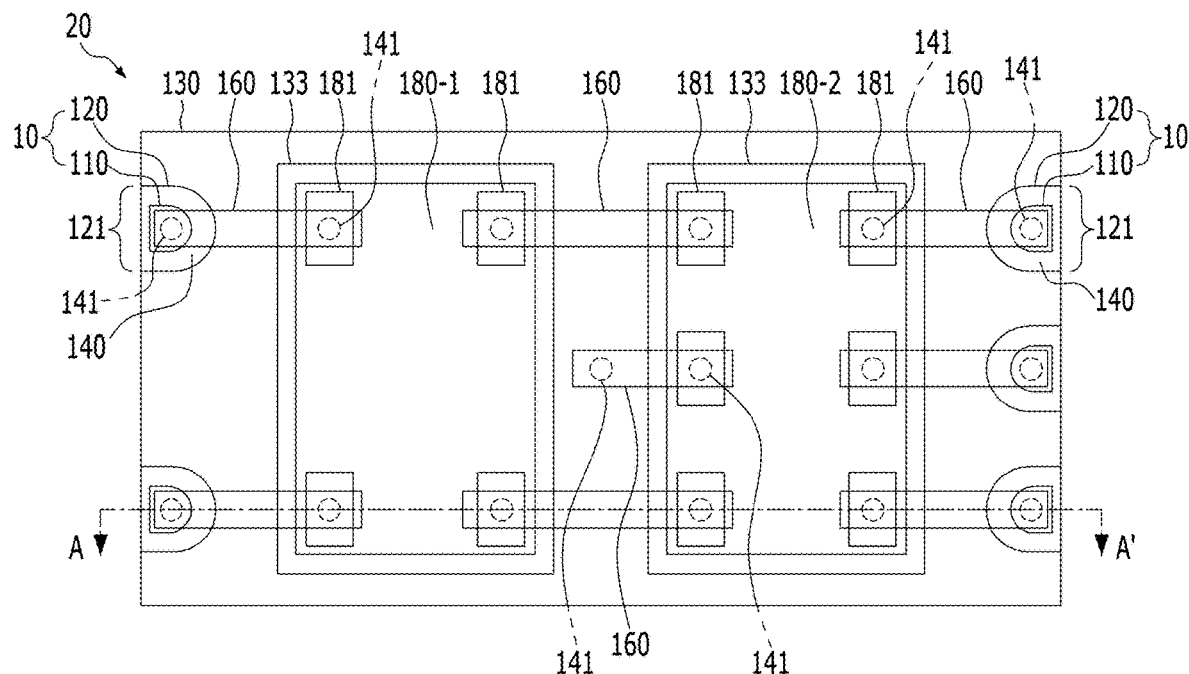
FIG. 10 is a plan view illustrating a semiconductor package including the quasi-coaxial transmission line according to an embodiment of the present invention.
Figure 11:
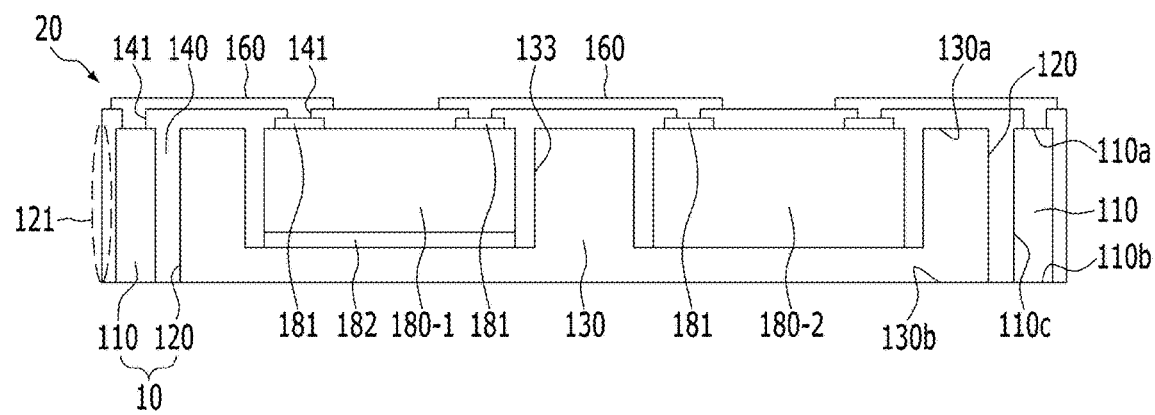
FIG. 11 is a cross-sectional view of the semiconductor package shown in FIG. 10, taken along line A-A' in FIG. 10.

FIG. 10 is a plan view showing a semiconductor package including the quasi-coaxial transmission line according to an embodiment of the present invention. FIG. 11 is a cross-sectional view of the semiconductor package shown in FIG. 10, taken along line A-A' in FIG. 10.

As illustrated in FIGS. 10 and 11, the semiconductor package 20 including the quasi-coaxial transmission line according to an embodiment of the present invention may include the base substrate 130 having at least one reception portion 133 formed therein, at least one semiconductor chip 180 received in the reception portion 133, the quasi-coaxial transmission line 10, which is formed through the upper surface 130a and the lower surface 130b of the base substrate 130 so as to transmit an electrical signal, the insulation layer 140 configured to cover the base substrate 130, the semiconductor chip 180 and the quasi-coaxial transmission line 10, and the electrode pattern 160 configured to electrically connect the semiconductor chip 180 to the quasi-coaxial transmission line 10 or to connect two or more semiconductor chips 180 to each other. The quasi-coaxial transmission line 10 may include the core 110, which is formed through the upper surface 130a and the lower surface 130b of the base substrate 130 so as to transmit an electrical signal, and the shield 120, which is spaced apart from the core 110 and which coaxially surrounds the side surface 110c of the core 110. The shield 120 may have the open portion 121, which is formed by removing at least a portion of one surface of the shield 120.

The base substrate 130 may have the reception portion 133 in which the semiconductor chip 180 is mounted. The reception portion 133 may include one or two or more reception portions, which are capable of accommodating one or two or more semiconductor chips 180 therein. The reception portion 133 may be formed in one surface of the base substrate 130 in a groove shape, or may have the shape of a hole formed through the upper surface 130a and the lower surface 130b of the base substrate 130.

The semiconductor chip 180 is capable of being operated in a high frequency range or in a high power range. The semiconductor chip 180 may be provided on one surface thereof with an electrode pad 181 for input and output of an electrical signal. Here, the one surface of the semiconductor chip 180, on which the electrode pad 181 is formed, may be referred to as an active surface. One or two or more semiconductor chips 180 may be mounted in the reception portion 133. The two or more semiconductor chips 180 may be the same kind of semiconductor chips or different kinds of semiconductor chips. The semiconductor chip 180 may be mounted in the reception portion 133 such that the active surface thereof faces the upper surface of the base substrate 130. The semiconductor chip 180 may further include a rear surface connection pad 182, which is provided at the surface opposite the one surface of the semiconductor chip 180, on which the electrode pad 181 is formed, so as to be used for ground connection. As illustrated in FIG. 11, for example, a first semiconductor chip 180-1 may have the rear surface connection pad 182 formed on the rear surface thereof, and a second semiconductor chip 180-2 may not have the rear surface connection pad 182 on the rear surface thereof.

Since the quasi-coaxial transmission line 10 has been described with reference to FIGS. 1 to 9, a redundant description thereof is omitted. The quasi-coaxial transmission line 10 may be formed through the upper surface and the lower surface of the semiconductor package so as to transmit an electrical signal. The quasi-coaxial transmission line 10 may include at least one quasi-coaxial transmission line, which is positioned along the periphery of the side surface of the semiconductor package. The open portion 121 may be formed in the shield 120 of the quasi-coaxial transmission line 10 so as to face toward the outside of the side surface of the semiconductor package. As illustrated in FIG. 10, for example, the quasi-coaxial transmission lines 10 may be formed at the opposite sides of the semiconductor package. The number and positions of quasi-coaxial transmission lines 10 may be determined depending on the number of electrode pads 181 of the semiconductor chip 180.

As illustrated in FIGS. 10 and 11, the insulation layer 140 may be formed between the core 110 and the shield 120 of the quasi-coaxial transmission line 10. The insulation layer 140 may be made of a material having electrical insulativity. The insulation layer 140 is formed between the core 110 and the shield 120 so as to prevent a short between the core 110 and the shield 120 and to physically secure the core 110 and the shield 120. The insulation layer 140 may be formed between the semiconductor chip 180 and the reception portion 133 in the base substrate 130. The insulation layer 140 physically secures the semiconductor chip 180 and the base substrate 130. The insulation layer 140 may be formed so as to cover the quasi-coaxial transmission line 10, the semiconductor chip 180 and the upper surface of the base substrate 130. The insulation layer 140 may include the via 141 for electrical connection. The via 142 formed in the insulation layer 140 may be formed at the upper portion of the core 110, the upper portion of the electrode pad 181 of the semiconductor chip 180 or the upper portion of the base substrate 130.

The electrode pattern 160 may be formed on the insulation layer 140. The electrode pattern 160 may be made of metal having electrical conductivity, such as copper (Cu), aluminum (Al) or silver (Ag), an alloy including the metal, a polymer compound having electrical conductivity or another material having electrical conductivity. The electrode pattern 160 may be electrically connected to the core 110, the electrode pad 181 of the semiconductor chip 180 and the base substrate 130 through the via 141 formed in the insulation layer 140. The electrode pattern 160 may electrically connect the electrode pad 181 of the semiconductor chip 180 to the core 110 of the quasi-coaxial transmission line 10, may connect two or more electrode pads 181 of the semiconductor chips 180, or may connect the electrode pad 181 of the semiconductor chip 180 to the base substrate 180.

When the base substrate 130 is made of metal having electrical conductivity, the base substrate 130 may be used as an electrical ground. As illustrated in FIG. 10, the electrode pattern 160 may be formed so as to connect the electrode pad 181 of the second semiconductor chip 180 to the base substrate 130, thereby providing the second semiconductor chip 180 with a ground. As illustrated in FIG. 11, the rear surface connection pad 182 of the first semiconductor chip 180 may be connected to the base substrate 130 such that the base substrate 130 serves as the ground of the first semiconductor chip 180.

Figure 12:
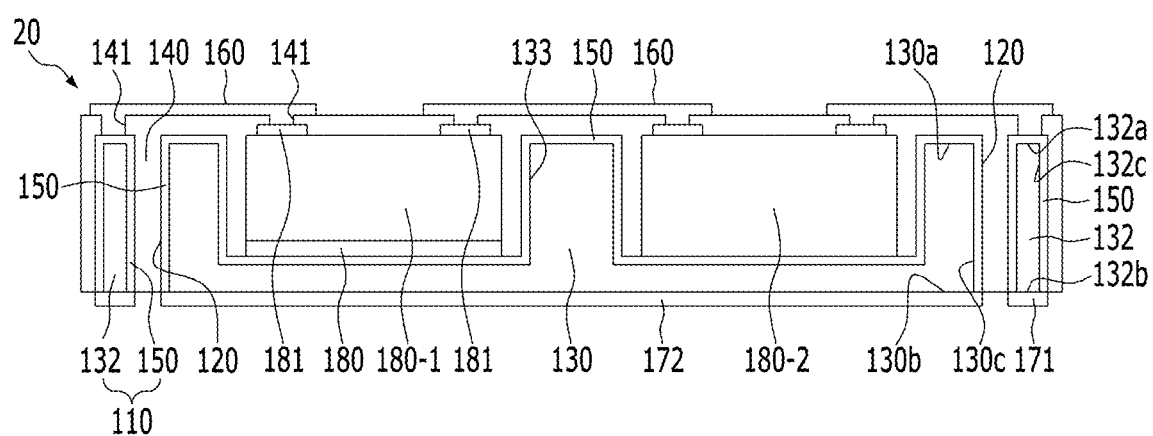
FIG. 12 is a cross-sectional view of another configuration of the semiconductor package shown in FIG. 10, taken along line A-A' in FIG. 10.

FIG. 12 is a cross-sectional view of another configuration of the semiconductor package shown in FIG. 10, taken along line A-A' in FIG. 10.

When the base substrate 130 is made of a material having little or no electrical conductivity, the semiconductor package 20 including the quasi-coaxial transmission line according to an embodiment of the present invention may further include the conductive layer 150 having electrical conductivity, which is formed on the upper surface 130a and the side surface 130c of the base substrate 130. The conductive layer 150 may be formed so as to cover the surface of the base substrate 130. The conductive layer 150 may be formed on the surface of the pole 132 and the surface of the base substrate 130. The conductive layer 150 may be formed on the surface of the base substrate 130 so as to provide the semiconductor package with an electrical ground. As illustrated in FIG. 10, the conductive layer 150 may be connected to the electrode pad 181 of the semiconductor chip 180 via the electrode pattern 160 so as to provide the semiconductor chip 180 with an electrical ground. As illustrated in FIG. 12, the rear surface connection pad 182 of the first semiconductor chip 180 may be connected to the conductive layer 150 such that the conductive layer 150 provides the first semiconductor chip 180 with an electrical ground. Since the heat generated by the semiconductor chip 180 is transmitted to the rear surface of the semiconductor package through the conductive layer 150, the heat radiation performance of the semiconductor package is improved.

The semiconductor package 20 including the quasi-coaxial transmission line according to an embodiment of the present invention may further include the first connection pad 171, which is formed on the lower end of the core 110 so as to provide the contact for the external circuit board 30, and the second connection pad 172, which is formed on the lower end of the shield 120 so as to provide a contact for the external circuit board 30. The first connection pad 171 is configured so as to be connected to the conductive layer 150 formed on the lower end of the side surface 132c of the pole 132. The second connection pad 172 is configured so as to be connected to the conductive layer 150 formed on the side surface 130c of the base substrate 130 that faces the core 110. The second connection pad 172 may be formed on all or part of the lower surface 130b of the base substrate 130. The second connection pad 172 may be formed so as to correspond to the shield 120 and to surround the first connection pad 171, but may not be formed at the open portion 121 of the shield 120. Since the second connection pad 172 is configured so as to surround the first connection pad 171 in conjunction with the shield 120, distortion of an electrical signal passing through the first connection pad 171 is prevented.

As described above, since the semiconductor package 20 including the quasi-coaxial transmission line according to an embodiment of the present invention is configured such that the conductive layer 150 formed on the base substrate 130, or the base substrate 130 itself, provides an electrical ground in packaging of the semiconductor chip 180 adapted to be operated in a high frequency range, it is possible to stably transmit an electrical signal, which has been transmitted through the electrode pattern 160. Furthermore, the quasi-coaxial transmission line 10 enables an electrical signal in a high frequency range to be transmitted to the lower surface from the upper surface of the semiconductor package without distortion of the electrical signal. In addition, when the semiconductor package 20 including the quasi-coaxial transmission line is connected to the external circuit board 30, it is possible to transmit an electrical signal between the semiconductor package and the external circuit board 30 without distortion of the electrical signal because there is no shorted area (see the area (area-3) in FIG. 5) and there is no need for the bump (see Bp in FIG. 6) by virtue of the open portion 121 formed in the shield 120, as described above with reference to FIGS. 7 to 9.

FIGS. 13, 14, 15 and 16 are views illustrating a method of manufacturing the quasi-coaxial transmission line according to an embodiment of the present invention.

The method of manufacturing the quasi-coaxial transmission line according to an embodiment of the present invention may include a substrate-forming operation (S10) of forming a groove-shaped cavity 131, which surrounds the core 110 and which is open at the side surface of the base substrate 130, in the first surface of the base substrate 130, an insulation-layer-forming operation (S21) of forming the insulation layer 140 in the cavity 131, and a core separation operation (S30) of removing a portion of the second surface of the base substrate 130 so as to physically separate the lower surface 110b of the core 110 from the base substrate 130.

The cavity 131 may be formed so as to surround a single core 110 or two or more cores 110, which are spaced apart from each other. In this case, the method of manufacturing the quasi-coaxial transmission line according to an embodiment of the present invention may further include, after the core separation operation (S30), an open-portion-forming operation (S40) of cutting the base substrate 130 between one core 110 and the cavity 131 or between two or more cores 110 that are spaced apart from each other.

Furthermore, the method of manufacturing the quasi-coaxial transmission line according to an embodiment of the present invention may further include, after the insulation-layer-forming operation (S21), an electrode-pattern-forming operation (S22) of forming at least one via 141 for electrical connection in the insulation layer 140 and forming the electrode pattern 160, which is electrically connected to the core 110 via the via 141.

FIGS. 13 to 16 are views showing the operations of the method of manufacturing the quasi-coaxial transmission line according to an embodiment of the present invention in which a first case (Case-1) in which the open portion 121 is formed in the operation of forming the cavity 131, a second case (Case-2) in which the cavity 131 is configured so as to include one core 110 and the open portion 121 is formed by cutting the cavity 131, and a third case (Case-3) in which the cavity 131 is configured so as to include two or more cores 110 and two or more quasi-coaxial transmission lines 10 are formed by cutting the cavity 131 are illustrated in a single base substrate 130.

Figure 13:
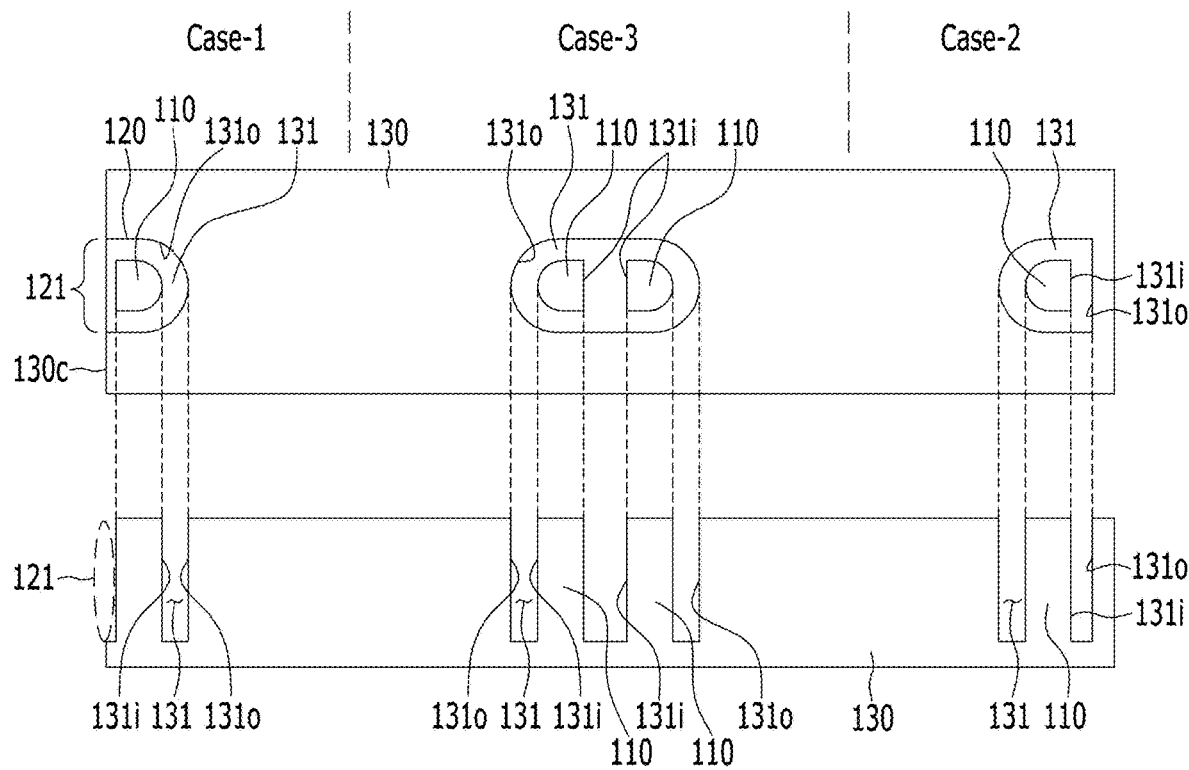
FIGS. 13, 14, 15, and 16 are views illustrating a method of manufacturing the quasi-coaxial transmission line according to an embodiment of the present invention.

FIG. 13 is a view illustrating the substrate-forming operation (S10) of the method of manufacturing the quasi-coaxial transmission line according to an embodiment of the present invention. FIG. 13 illustrates a plan view of the base substrate 130, which has been formed, as well as a cross-sectional view, taken along line A-A' in FIG. 16.

As illustrated in FIG. 13, in the substrate-forming operation (S10), one surface (the first surface) of the base substrate 130 is treated so as to form the cavity 131 through a process such as etching. One surface (the first surface) is the upper surface 130a of the base substrate 130, and other surface (the second surface) is the lower surface 130b of the base substrate 130. The cavity 131 may accommodate therein one core 110 (Case-1 and Case-2) or two or more cores 110 that are spaced apart from each other (Case-3). The cavity 131 may be formed so as to have a doughnut shape defined by an inner side surface 131i and an outer side surface 131o that face each other. The cavity 131 is formed into a groove shape in one surface of the base substrate 130 so as to define the space between the core 110 and the shield 120. In other words, the portion of the base substrate 130 that is defined by the inner side surface 131i of the cavity 131 becomes the core 110, and the outer side surface 131o of the cavity 131 becomes the shield 120. The cavity 131 may be configured such that a portion of the outer side surface 131o is open at the side surface of the base substrate 130 (Case-1). In this case, the open portion 121 of the shield is formed while the cavity 131 is formed in the substrate-forming operation (S10).

Figure 14:
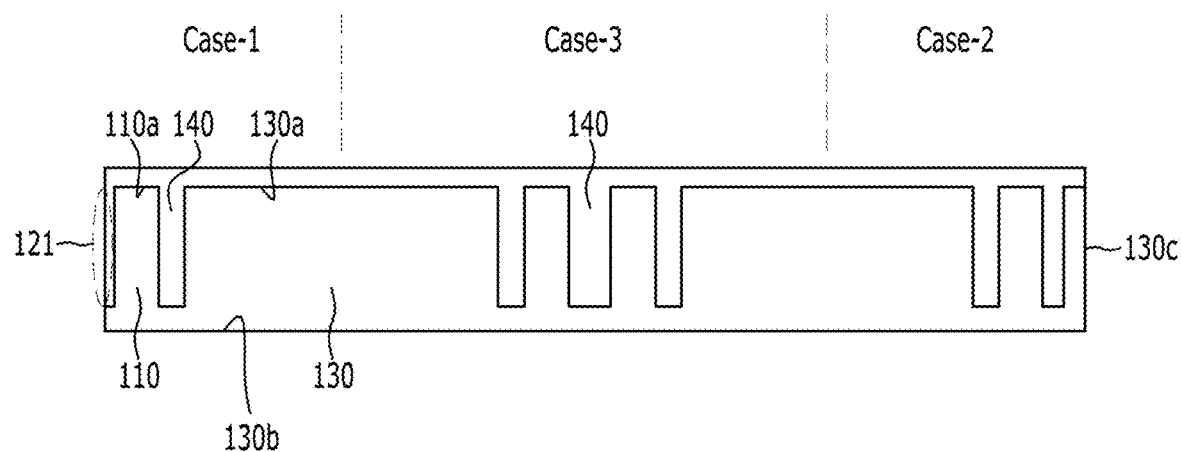
Figure 16:
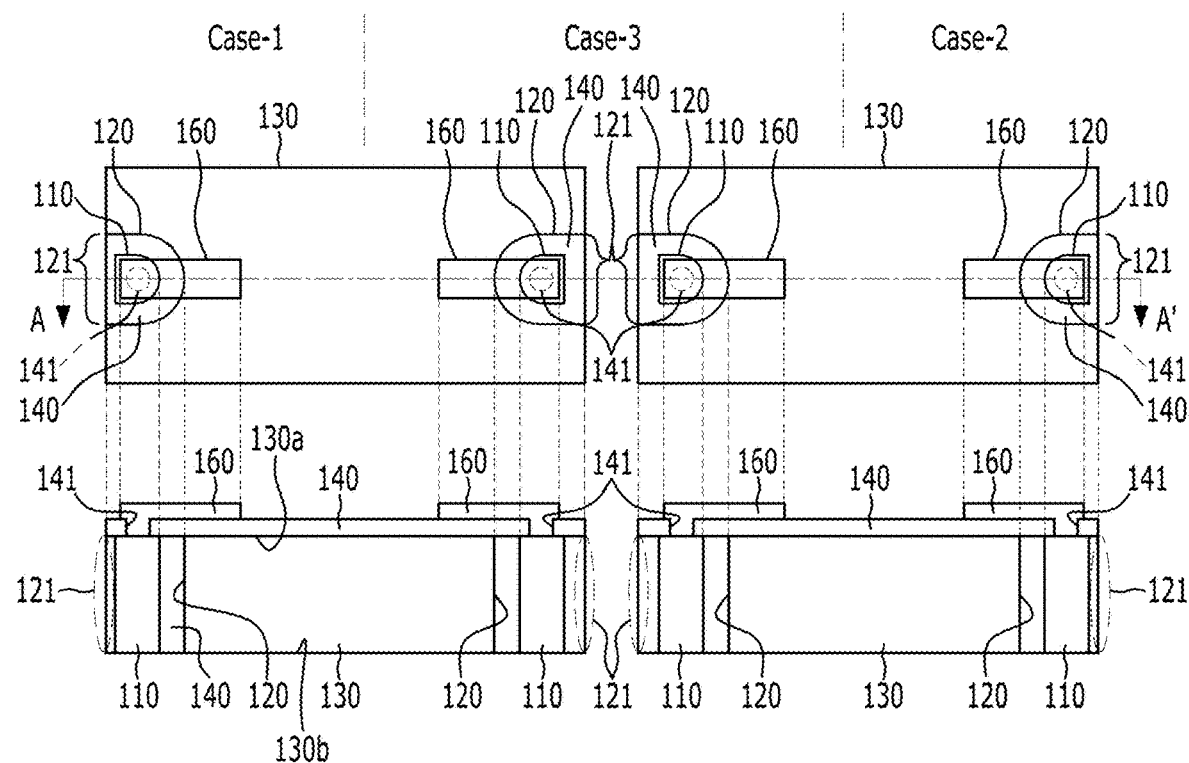

FIG. 14 is a cross-sectional view corresponding to the plan view of FIG. 13, taken along line A-A' in FIG. 16, and illustrates the insulation-layer-forming operation (S21).

As illustrated in FIG. 14, in the insulation-layer-forming operation (S21), the insulation layer 140 is formed in the cavity 131 formed in the base substrate 130. The insulation layer 140 may be charged in the cavity 131, and may cover the upper surface 110a of the core 110 or the upper surface 130a of the base substrate 130. Since the insulation layer 140 is formed in the cavity 131, the core 110 and the shield 120 may be physically secured even when the core separation operation (S30) is performed. In the case (Case-1) in which the outer side surface 131o of the cavity 131 is open at the side surface 130c of the base substrate 130, the insulation layer 140 may be formed along the boundary of the base substrate 130. In the case (Case-3) in which two or more cores 110 are formed in the cavity 131, the insulation layer 140 is charged between the two or more cores 110 and between the cores 110 and the cavity 131.

Figure 15:
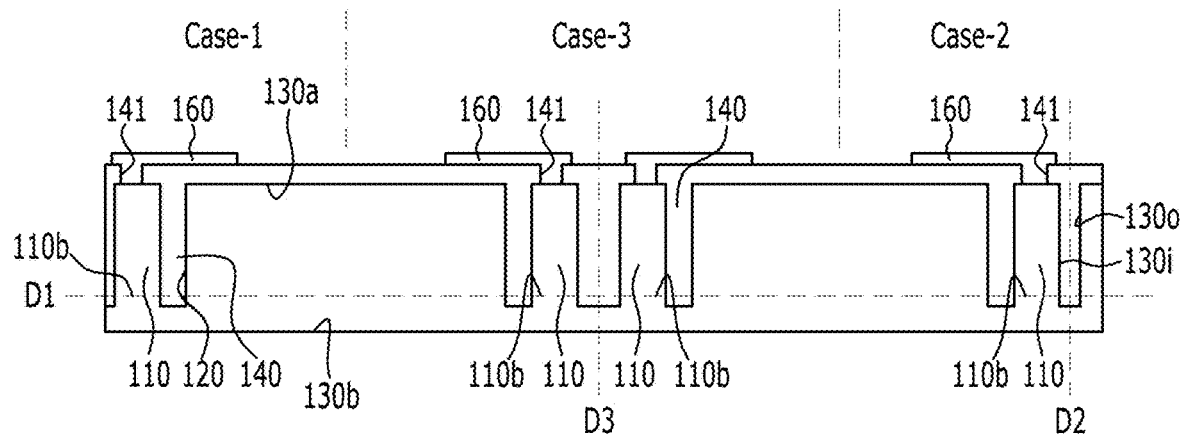

FIG. 15 is a cross-sectional view corresponding to the plan view of FIG. 13, taken along line A-A' in FIG. 16, which illustrates the electrode-pattern-forming operation (S22). FIG. 16 illustrates a plan view and a cross-sectional view of the quasi-coaxial transmission line 10, which is formed by cutting the base substrate 130 along the cutting line D1 in FIG. 15.

As illustrated in FIG. 15, in the electrode-pattern-forming operation (S22), the via 141 for electrical connection is formed in the insulation layer 140, and the electrode pattern 160, which is connected to the core 110 through the via 141, is formed. The electrode pattern 160 may be connected to the upper end of the core 110 so as to transmit an electrical signal to the core 110.

As illustrated in FIG. 15, in the core separation operation (S30), a portion of the other surface (the second surface) of the base substrate 130 is removed by cutting the base substrate 130 along the cutting line D1. The cutting line D1 may be set to be the location at which the lower surface 110b of the core 110 is physically separated from the base substrate 130. In the state in which the lower end of the core is physically connected to the base substrate 130, the core 110 may be separated from the base substrate 130 by removing the other surface of the base substrate 130. Removing the other surface of the base substrate 130 may be performed through chemical-mechanical polishing (CMP). In the case (Case-1) in which the side surface of the cavity 131 is open at the side surface of the base substrate 130, after the core separation operation (S30), the quasi-coaxial transmission line 10, in which the core 110 and the shield 120 are separated and in which the open portion 121 is present at the one side surface of the shield 120, is prepared, as illustrated in FIG. 16.

As illustrated in FIG. 15, in the case (Case-2) in which the cavity 131 surrounds one core 110, in the open-portion-forming operation (S40) after the core separation operation (S30), the base substrate 130 is cut along the cutting line D2 between the core 110 and the cavity 131. After the base substrate 130 is cut along the cutting line D2, the quasi-coaxial transmission line 10, in which the side surface of the cavity 131 is open at the side surface of the base substrate 130 and thus the open portion 121 is formed in one side surface of the shield 120, is prepared, as illustrated in FIG. 16.

As illustrated in FIG. 15, in the case (Case-3) in which the cavity 131 surrounds two cores 110, which are spaced apart from each other, in the open-portion-forming operation (S40) after the core separation operation (S30), the base substrate 130 is cut along the cutting line D3 between the two cores 110, which are spaced apart from each other. After the base substrate 130 is cut along the cutting line D3, one quasi-coaxial transmission line 10 is prepared at the left base substrate 130 and another quasi-coaxial transmission line 10 is prepared at the right base substrate 130, with respect to the cutting line D3, as illustrated in FIG. 16. After the base substrate 130 is cut along the cutting line D3, the side surface of the shield 120 is open at the side surface of the base substrate 130 at the region at which the cutting line D3 intersects the cavity 131, thereby providing the open portion 121. In other words, it is possible to manufacture a plurality of quasi-coaxial transmission lines 10, which are separated along the cutting line D3.

By performing the above-described operations, it is possible to manufacture the quasi-coaxial transmission line 10 shown in FIGS. 1 and 2.

FIGS. 17, 18, 19 and 20 are views illustrating the method of manufacturing the quasi-coaxial transmission line 10 according to an embodiment of the present invention, which further includes a conductive-layer-forming operation (S15).

FIGS. 17 to 20 are views showing the operations of the method of manufacturing the quasi-coaxial transmission line according to an embodiment of the present invention in which a first case (Case-1) in which the open portion 121 is formed in the operation of forming the cavity 131, a second case (Case-2) in which the cavity 131 is configured so as to include one core 110 and the open portion 121 is formed by cutting the cavity 131, and a third case (Case-3) in which the cavity 131 is configured so as to include two or more poles 132 and two or more quasi-coaxial transmission lines 10 are formed by cutting the cavity 131, are illustrated in a single base substrate 130.

The method of manufacturing the quasi-coaxial transmission line 10 according to an embodiment of the present invention may include the substrate-forming operation (S10) of forming the groove-shaped cavity 131, which surrounds the pole 132 and which is open at the side surface 130c of the base substrate 130, in the base substrate 130, the insulation-layer-forming operation (S21) of forming the conductive layer 150 on the surface of the pole 132 and on the surface of the base substrate 130, and a core separation operation (S30) of removing the conductive layer 150 formed on the lower surface of the cavity 131 while removing a portion of the other surface of the base substrate 130 so as to separate the conductive layer 150 formed on the pole 132 from the conductive layer 150 formed on the inner surface of the cavity 131, thereby providing the core 110 and the shield 120.

The cavity 131 may be formed so as to surround one pole 132 or two or more poles 132, which are spaced apart from each other. In this case, the method according to an embodiment of the present invention may further include, after the core separation operation (S30), the open-portion-forming operation (S40) of cutting the base substrate 130 between the one core 110 and the cavity 131 or between the two or more cores 110, which are spaced apart from each other.

Figure 17:
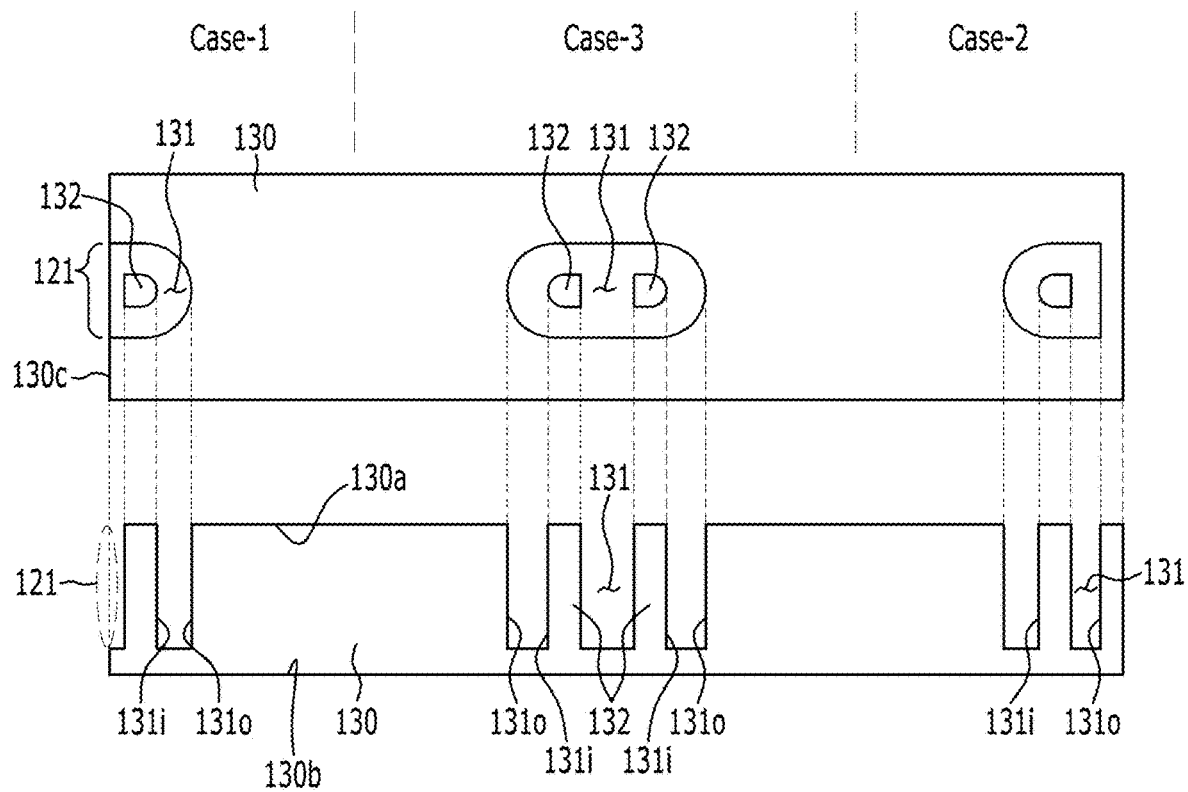
FIGS. 17, 18, 19, and 20 are views illustrating the method of manufacturing the quasi-coaxial transmission line according to an embodiment of the present invention, which further includes a conductive-layer-forming operation.

The substrate-forming operation (S10) shown in FIG. 17 is generally similar to the substrate-forming operation (S10) shown in FIG. 13. FIG. 17 is a view illustrating the substrate-forming operation (S10) of the method according to an embodiment of the present invention. FIG. 17 illustrates a plan view of the formed base substrate 130 and a cross sectional view, taken along line A-A' in FIG. 20.

As illustrated in FIG. 17, in the substrate-forming operation (S10), one surface (the first surface) of the base substrate 130 is treated so as to form the cavity 131 through a process such as etching. The cavity 131 may include one pole 132 (Case-1 and Case-2) or two or more poles 132 (Case-3), which are spaced apart from each other. The cavity 131 may be formed into a groove shape in the one surface 130, thereby defining the space between the pole 132, which will become the core 110, and the side surface of the base substrate 130, on which the shield 120 will be formed. In other words, the portion of the base substrate 130 that remains in the cavity 131 becomes the pole 132, and the conductive layer 150, which will be subsequently formed on the outer surface 131o of the cavity 131, becomes the shield 120. The cavity 131 may be configured such that a portion of the outer surface 131o thereof is open at the side surface of the base substrate 130 (Case-1). In this case, the open portion 121 is formed while the cavity 131 is formed in the substrate-forming operation.

Figure 18:
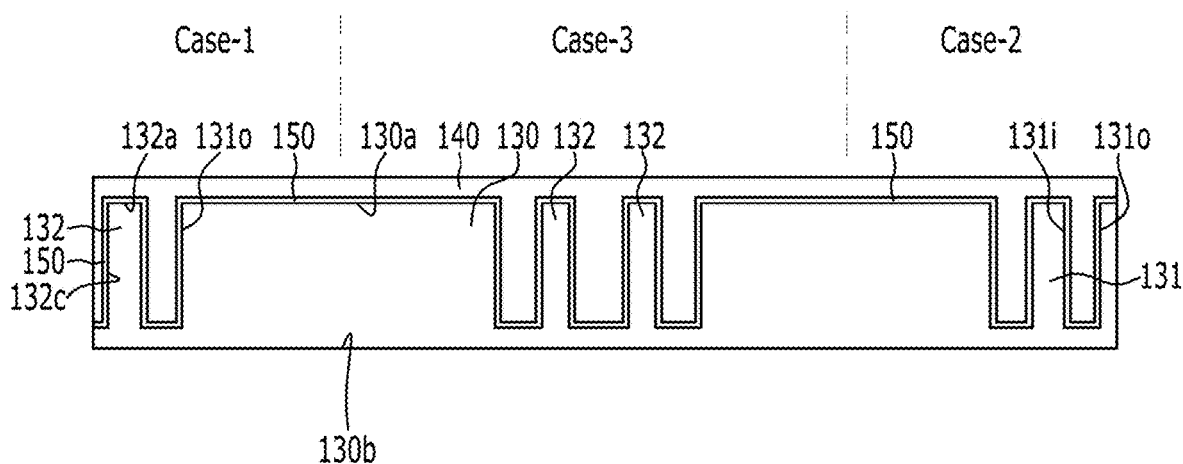
Figure 20:
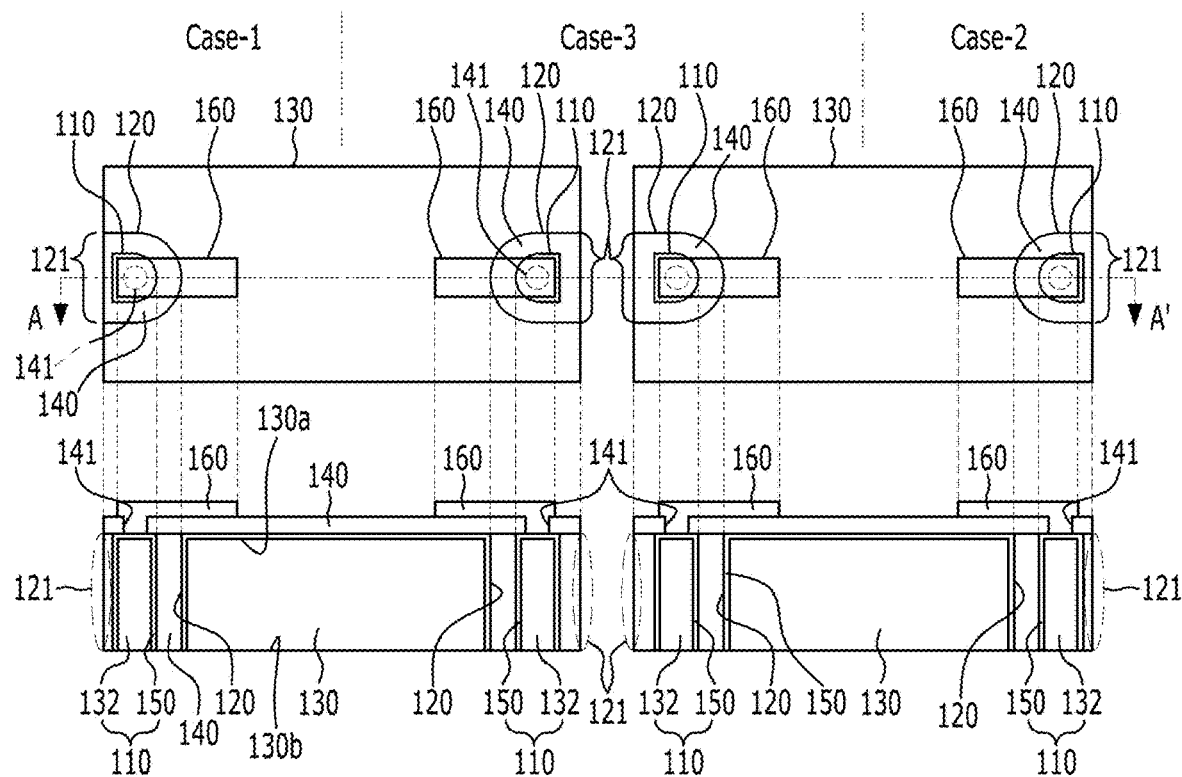

FIG. 18 is a cross-sectional view of the plan view of FIG. 17, taken along line A-A' in FIG. 20. FIG. 18 illustrates the conductive-layer-forming operation (S15) and the insulation-layer-forming operation (S21).

As illustrated in FIG. 18, in the conductive-layer-forming operation (S15), the conductive layer 150, which is made of an electrocondcutive material, is formed on the base substrate 130. The conductive layer 150 may be made of metal having electrical conductivity, such as copper (Cu), aluminum (Al) or silver (Ag), an alloy including the metal, a polymer compound having electrical conductivity or another material having electrical conductivity. The conductive layer 150 may be formed through a known process such as plating and coating. The thickness of the conductive layer 150 may be determined by calculating the skin depth according to the frequency of the electrical signal to be transmitted.

The conductive layer 150 may be formed on at least one surface among the upper surface 130a, the reception portion 133, the cavity 131 and the pole 132 of the base substrate 130. The conductive layer 150, which is formed on the upper surface 132a and the side surface 132c of the pole 132, may be separated from the conductive layer 150 formed on the base substrate 300 so as to constitute the core 110 in conjunction with the pole 132 through the core separation operation. The conductive layer 150, which is formed on the outer side surface 131o of the cavity 131, that is, on the portion of the side surface of the base substrate 130 that faces the pole 132, may be separated from the conductive layer 150 formed on the pole 132 so as to become the shield 120 through the core separation operation S30.

As illustrated in FIG. 18, in the insulation-layer-forming operation, the insulation layer 140 is formed on the conductive layer 150. The insulation layer 140 may be charged into the cavity 131 so as to cover the upper surface 132a of the pole 132 or the upper surface 130a of the base substrate 130. By forming the insulation layer 140 in the cavity 131, the core 110 and the shield 120 may be physically secured even when the core separation operation (S30) is performed. In the case (Case-1) in which the outer side surface 131o of the cavity 131 is open at the side surface of the base substrate 130, the conductive layer 150 and the insulation layer 140 may be formed along the boundary of the base substrate 130. In the case (Case-3) in which two or more cores 110 are formed in the cavity 131, the insulation layer 140 may be charged between the two or more cores 110 and between the cores 110 and the cavity 131.

Figure 19:
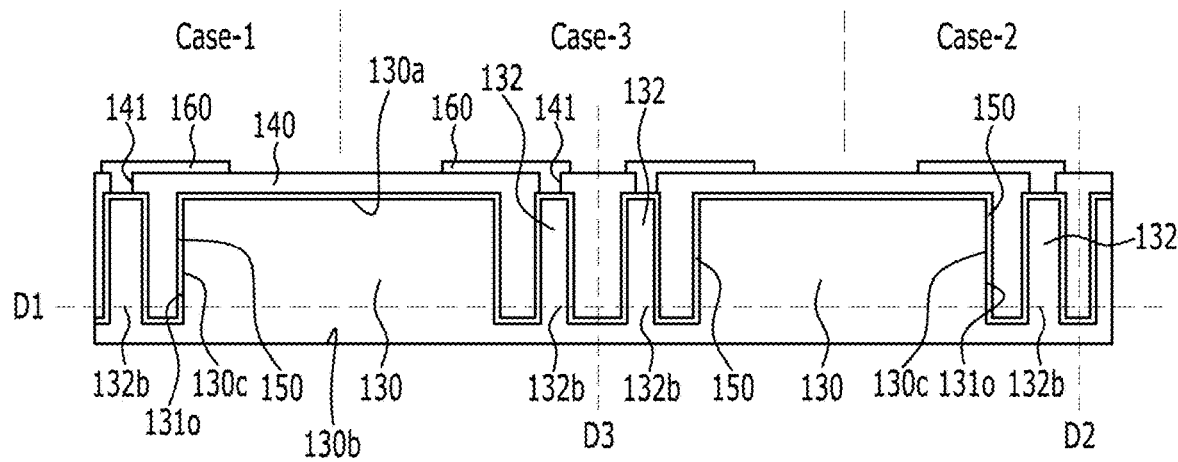

FIG. 19 is a cross-sectional view of the plan view of FIG. 17 taken along line A-A' in FIG. 20. FIG. 20 illustrates a plan view and a cross-sectional view of the quasi-coaxial transmission line 10, which is prepared by cutting the base substrate 130 along the cutting line in FIG. 17.

As illustrated in FIG. 19, in the electrode-pattern-forming operation (S22), the via 141 for electrical connection is formed in the insulation layer 140, and the electrode pattern 160, which is connected to the core 110 through the via 141, is formed. The electrode pattern 160 may be connected to the upper end of the core 110 so as to transmit an electrical signal to the core 110.

As illustrated in FIG. 19, in the core separation operation (S30), a portion of the other surface (the second surface) of the base substrate 130 is removed by cutting the base substrate 130 along the cutting line D1. The cutting line D1 may be set to be the location at which the conductive layer 150 formed on the pole 132 is physically separated from the conductive layer 150 formed on the outer side surface 131o of the cavity 131. In the state in which the lower surface 132b of the pole 132 is physically connected to the base substrate 130, the pole 132 is separated from the base substrate 130 by removing the other surface of the base substrate 130. In the state in which the conductive layer 150 formed on the pole 132 is connected to the conductive layer 150 formed on the base substrate 130, the pole 132 is separated from the base substrate 130 by removing the other surface of the base substrate 130 as well as the conductive layer 150 formed on the lower surface of the cavity 131. Removing the other surface of the base substrate 130 may be performed through chemical-mechanical polishing (CMP). In the case (Case-1) in which the outer side surface 131o of the cavity 131 is open at the side surface of the base substrate 130, by performing the core separation operation S30, the quasi-coaxial transmission line 10, in which the core 110 is separated from the shield 120 and the open portion 121 is present in one side surface of the shield 120, is prepared, as illustrated in FIG. 20.

As illustrated in FIG. 19, in the case in which the cavity 131 is configured so as to surround one pole 132, in the open-portion-forming operation (S40) after the core separation operation (S30), the base substrate 130 is cut along the cutting line D2 between the core 110 and the cavity 131. By cutting the base substrate 130 along the cutting line D2, a portion of the conductive layer 150 formed on the outer side surface 131o of the cavity 131 is removed, and thus the quasi-coaxial transmission line 10, in which the open portion 121 is formed in one side surface of the shield 120, is prepared, as illustrated in FIG. 20.

As illustrated in FIG. 19, in the case (Case-3) in which the cavity 131 is configured so as to surround two poles 132, which are spaced apart from each other, in the open-portion-forming operation (S40) after the core separation operation (S30), the base substrate 130 is cut along the cutting line D3 between the two cores 110, which are spaced apart from each other. By cutting the base substrate 130 along the cutting line D3, one quasi-coaxial transmission line 10 is formed at the left base substrate 130 and one quasi-coaxial transmission line 10 is formed at the right base substrate 130, with respect to the cutting line D3, as illustrated in FIG. 16. By cutting the base substrate 130 along the cutting line D3, the conductive layer 150 is separated at the location at which the cutting line D3 intersects the cavity 131, and thus one side of the shield 120 is removed, thereby providing the open portion 121.

By performing the above-mentioned operations, the quasi-coaxial transmission lines 10 shown in FIGS. 1 to 4 may be manufactured.

FIGS. 21, 22, 23 and 24 are views illustrating the operations of the method of manufacturing the semiconductor package including the quasi-coaxial transmission line according to an embodiment of the present invention.

The method of manufacturing the semiconductor package including the quasi-coaxial transmission line according to an embodiment of the present invention may include a substrate-forming operation (S10) of forming at least one cavity 131 surrounding one pole 132 or two or more poles 132, which are spaced apart from each other, and at least one reception portion 133, in one surface (the first surface) of a base substrate 130, a conductive-layer-forming operation (S15) of forming a conductive layer 150 made of an electroconductive material on the one surface of the base substrate 130, a mounting operation (S17) of mounting a semiconductor chip 180 in the at least one reception portion 144, a wiring-layer-forming operation (S20) of forming an insulation layer 140 covering the base substrate 130 and the semiconductor chip 180 and forming an electrode pattern 160 for transmission of an electrical signal on the insulation layer 140, a core separation operation (S30) of removing the conductive layer 150 formed on the lower surface of the cavity 131 while removing a portion of the other surface (the second surface) of the base substrate 130 so as to separate the conductive layer 150 formed on the pole 132 from the conductive layer 150 formed on the inner surface of the cavity 131, thereby providing the core 110 and the shield 120, and an open-portion-forming operation (S40) of cutting the base substrate 130 between the cavity 131 and the core 110 or between the two or more poles 132 so as to remove at least a portion of one side surface of the shield 120, thereby providing an open portion 121.

Figure 21:
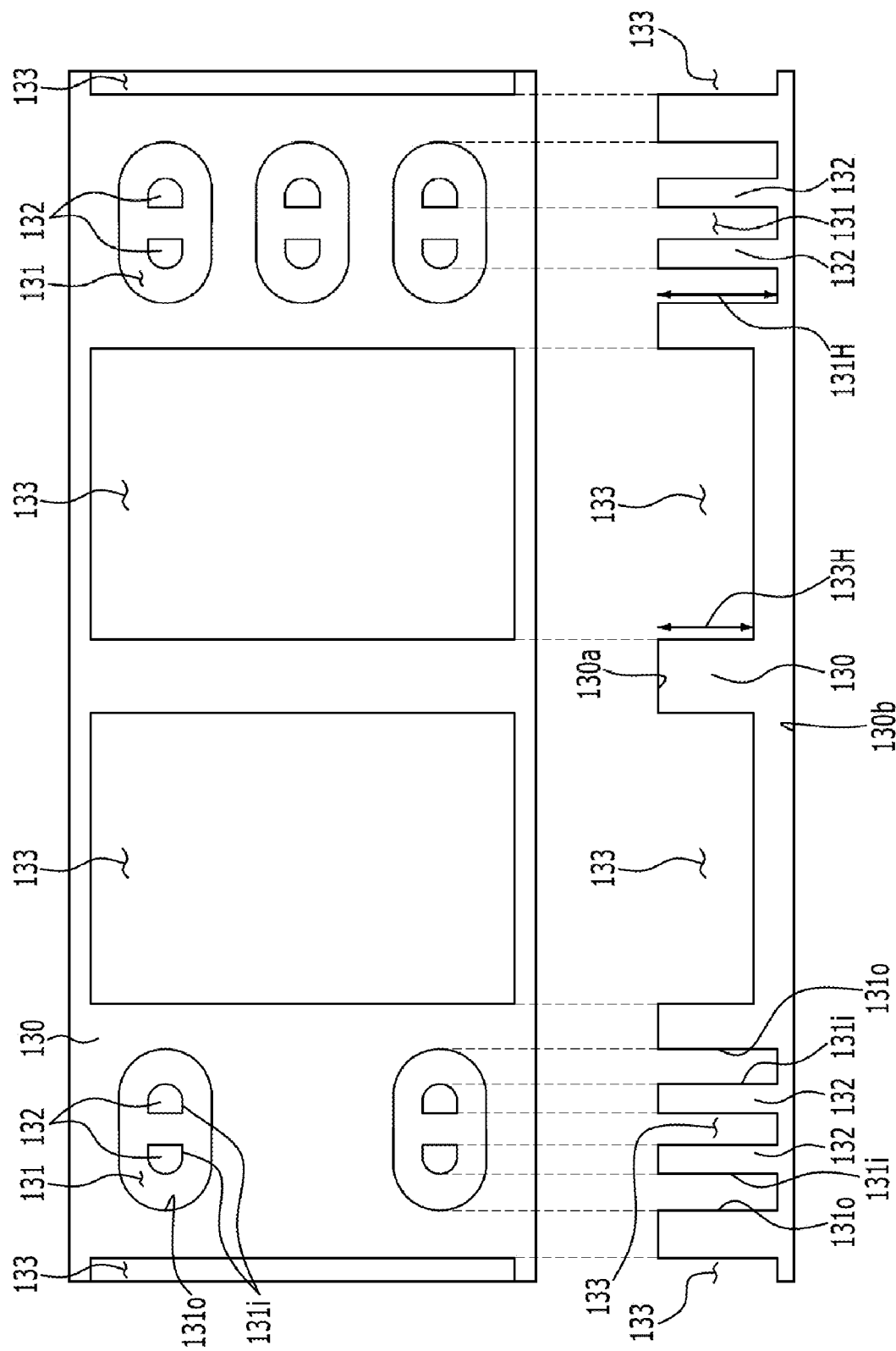

FIG. 21 is a view illustrating the substrate-forming operation (S10) of the method of manufacturing the semiconductor package including the quasi-coaxial transmission line according to an embodiment of the present invention. FIG. 21 illustrates a plan view of the base substrate 130, which has been formed, and a cross-sectional view of the base substrate (130), taken along line A-A' in FIG. 10.

As illustrated in FIG. 21, in the substrate-forming operation (S10), the reception portion 133 for receiving the groove-shaped cavity 131 and the semiconductor chip 180 may be formed in one surface of the base substrate 130. The reception portion 133 and the cavity 131 may be configured so as to be spaced apart from each other. The cavity 131 may include a predetermined number of cavities required for signal transmission of the semiconductor chip 180 to be mounted in the reception portion 133. The depth 133H of the reception portion 133 may be determined according to the height of the semiconductor chip 180, and the depth 131H of the cavity 131 may be greater than the depth 133H of the reception portion 133. When the depth 131H of the cavity 131 is greater than the depth 133h of the reception portion 133, it is possible to prevent damage to the semiconductor chip 180 mounted in the reception portion 133 when the core separation operation (S30) is performed. When the depth 133H of the reception portion 133 and the depth 131H of the cavity 131 are minimized, it is possible to reduce the height of the semiconductor package.

A plurality of reception portions 133 and a plurality of cavities 131 may be formed in a single base substrate 130 in order to manufacture a plurality of semiconductor packages. As illustrated in FIG. 21, for example, the plurality of cavities 131 and the plurality of reception portions 133 may be formed in such a manner that two reception portions 133 are formed in the center of the base substrate 130, two cavities 131 surrounding two poles 132 are formed to the left of the reception portions 133, three cavities 131 surrounding the two poles 132 are formed to the right of the reception portions 133, and reception portions 133 are further formed in the side surfaces of the cavities 131.

Figure 22:
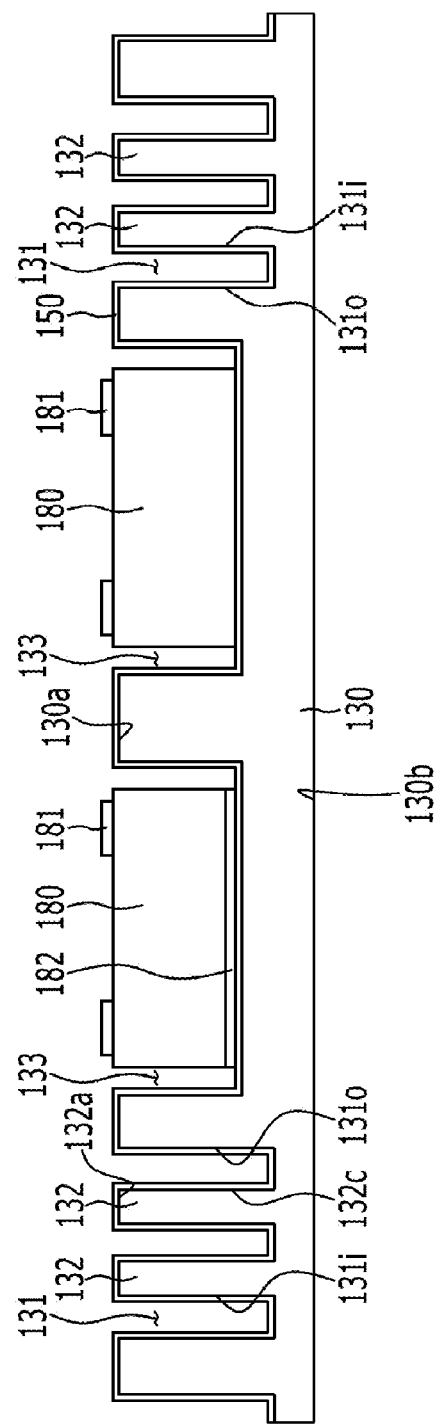

FIG. 22 is a cross-sectional view illustrating the conductive-layer-forming operation (S15) and the mounting operation (S17).

As illustrated in FIG. 22, in the conductive-layer-forming operation (S15), the conductive layer made of an electroconductive material 150 may be formed on one surface of the base substrate 130. The conductive layer 150 may be formed on the surfaces 132a and 132c of the pole 132, the inner surfaces 131i and 131o of the cavity 131, the upper surface 130a of the base substrate 130, and the inner surface of the reception portion 133. In the mounting operation (S17), the semiconductor chip 180 may be mounted in the reception portion 133 in the base substrate 130. The semiconductor chip 180 may be mounted on the conductive layer 150 formed on the inner surface of the reception portion 133.

Figure 23:
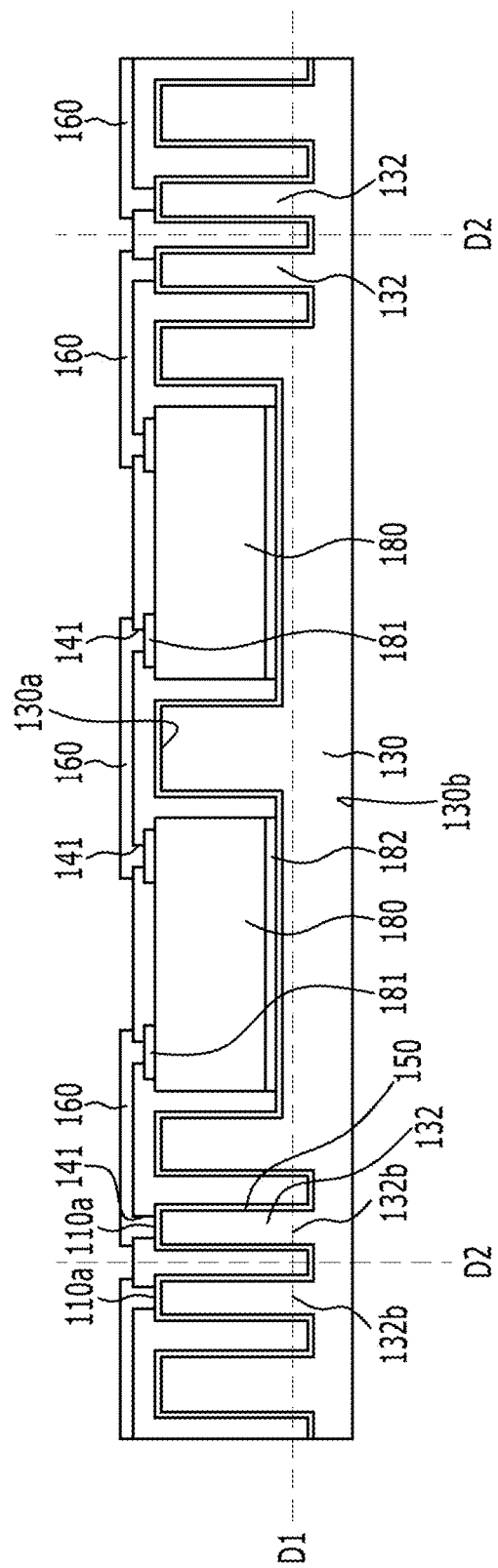

FIG. 23 is a view illustrating the wiring-layer-forming operation (S20).

The wiring-layer-forming operation (S20) may include an insulation-layer-forming operation (S21) and an electrode-pattern-forming operation (S22). In the insulation-layer-forming operation (S21), the insulation layer 140 may be formed so as to be charged in the cavity 131 and the reception portion 133 while covering the base substrate 130 and the semiconductor chip 180. The insulation layer 140 may be made of an electroconductive material, and may be charged in the cavity 131. Consequently, it is possible to physically secure the core 110 and the shield 120 even when the core separation operation (S30) is subsequently performed. After the formation of the insulation layer 140, at least one via for electrical connection may be formed in the insulation layer 140. The via 141 may be configured so as to expose the upper surface 110a of the core 110, a portion of the base substrate 130 and the electrode pad 181 of the semiconductor chip 180. In the electrode-pattern-forming operation (S22), the electrode pattern 160, which serves to connect the core 110 to the electrode pad 181 of the semiconductor chip 180, to connect the electrode pads 181 of the semiconductor chip 180 to each other or to connect the electrode pad 181 of the semiconductor chip 180 to the base substrate 130 through the via 141 formed in the insulation layer 140, may be formed.

As illustrated in FIG. 23, in the core separation operation (S30), the base substrate 130 may be cut along the cutting line D1 so as to remove a portion of the other surface of the base substrate 130. The cutting line D1 may be set to be a location at which the conductive layer 150 formed on the pole 132 is physically separated from the conductive layer 150 formed on the outer side surface of the cavity 131. In the state in which the lower surface of the pole 132 is physically connected to the base substrate 130, the pole 132 may be separated from the base substrate 130 by removing the other surface of the base substrate 130. In the state in which the conductive layer 150 formed on the pole 132 is connected to the conductive layer 150 formed on the base substrate 130, the pole 132 may be separated from the base substrate 130 by removing the other surface of the base substrate 130 as well as the conductive layer 150 formed on the lower surface of the cavity 131. Removing the other surface of the base substrate 130 may be performed through chemical-mechanical polishing (CMP).

A connection-pad-forming operation (S35) may be performed between the core separation operation (S30) and the open-portion-forming operation (S40). In the connection-pad-forming operation (S35), the first connection pad 171, connected to the lower surface of the core 110, and the second connection pad 172, connected to the lower surface of the shield 120, may be formed. The first connection pad 171 may be formed so as to be connected to the conductive layer 150 of the core 110. Specifically, the first connection pad 171 may be connected to the conductive layer 150 formed on the lower surface of the pole 132 and on the lower end of the side surface 132c of the pole 132. The second connection pad 172 may be formed so as to be connected to the conductive layer 150 formed on the base substrate 130 that faces the core 110.

As illustrated in FIG. 23, in the case in which the cavity 131 is configured so as to surround two poles 132, which are spaced apart from each other, in the open-portion-forming operation (S40) after the core separation operation (S30), the base substrate 130 is cut along the cutting line D2 between the two poles 132, which are spaced apart from each other. By cutting the base substrate 130 along the cutting line D2, one quasi-coaxial transmission line 10 is formed at the left base substrate 130 and one quasi-coaxial transmission line 10 is formed at the right base substrate 130, with respect to the cutting line D2, as illustrated in FIG. 24. By cutting the base substrate 130 along the cutting line D2, the conductive layer 150 is separated at the location at which the cutting line D2 intersects the cavity 131, and thus one side of the shield 120 is removed, thereby providing the open portion 121. By cutting the base substrate 130 along the cutting line D2, a plurality of semiconductor packages may be manufactured from a single base substrate 130.

By performing the above-mentioned operations, the semiconductor package 20 including the quasi-coaxial transmission line shown in FIGS. 10 to 12 may be manufactured.

As is apparent from the above description, the present invention provides a quasi-coaxial transmission line capable of minimizing loss of an electrical signal in a millimeter-wave frequency range, a semiconductor package capable of realizing miniaturization and integration using the quasi-coaxial transmission line, and a method of manufacturing the quasi-coaxial transmission line and the semiconductor package.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A quasi-coaxial transmission line, used in a semiconductor package, comprising:
    a core, which is formed through an upper surface and a lower surface of a base substrate so as to transmit an electrical signal; and
    a shield, which is spaced apart from the core and which coaxially surrounds a side surface of the core, at least a portion of the shield being removed so as to form an open portion,
    wherein a portion of the side surface of the core is electrically exposed through the open portion.

2. The quasi-coaxial transmission line according to claim 1,
    wherein each of the core and the shield is made of a material having electrical conductivity,
    wherein the core is formed by forming a conductive layer on a surface of a pole, which is formed using a portion of the base substrate, and
    wherein the shield is formed by forming a conductive layer on a surface of the base substrate that faces the side surface of the core.

3. The quasi-coaxial transmission line according to claim 1, wherein the open portion is configured so as to face a side surface of the semiconductor package.

4. A quasi-coaxial transmission line, used in a semiconductor package, comprising:
    a core, which is formed through an upper surface and a lower surface of a base substrate so as to transmit an electrical signal; and
    a shield, which is spaced apart from the core and which coaxially surrounds a side surface of the core, at least a portion of the shield being removed so as to form an open portion,
    wherein each of the core and the shield is made of a material having electrical conductivity,
    wherein the core is formed by forming a conductive layer on a surface of a pole, which is formed using a portion of the base substrate,
    wherein the shield is formed by forming a conductive layer on a surface of the base substrate that faces the side surface of the core, and
    wherein a thickness of the conductive layer formed on the surface of the pole is determined by a skin depth, which is calculated based on a frequency of an electrical signal passing through the core.

5. A quasi-coaxial transmission line, used in a semiconductor package, comprising:
    a core, which is formed through an upper surface and a lower surface of a base substrate so as to transmit an electrical signal; and
    a shield, which is spaced apart from the core and which coaxially surrounds a side surface of the core, at least a portion of the shield being removed so as to form an open portion,
    wherein, when the quasi-coaxial transmission line is connected to an external circuit board, the open portion is formed to be open toward a path in which a signal electrode of the external circuit board is formed such that the signal electrode of the external circuit board does not overlap the shield.

6. A semiconductor package including a quasi-coaxial transmission line comprising:

a base substrate having at least one reception portion therein;

one or two or more semiconductor chips received in the reception portion;

the quasi-coaxial transmission line, which is formed through an upper surface and a lower surface of the base substrate so as to transmit an electrical signal;

an insulation layer configured to cover the base substrate, the semiconductor chip and the quasi-coaxial transmission line; and an electrode pattern configured to electrically connect the semiconductor chip to the quasi-coaxial transmission line or to electrically connect the two or more semiconductor chips to each other, wherein the quasi-coaxial transmission line comprises:

a core, which is formed through the upper surface and the lower surface of the base substrate so as to transmit an electrical signal; and a shield, which is spaced apart from the core and which coaxially surrounds a side surface of the core, at least a portion of the shield being removed so as to form an open portion.

7. The semiconductor package according to claim 6, wherein, when the quasi-coaxial transmission line is connected to an external circuit board, the open portion is formed to be open toward a path in which a signal electrode of the external circuit board is formed such that the signal electrode of the external circuit board does not overlap the shield.

8. The semiconductor package according to claim 6, further comprising:

a first connection pad formed at a lower end of the core so as to provide a contact for an external circuit board; and a second connection pad formed at a lower end of the shield so as to provide a contact for the external circuit board.

9. The semiconductor package according to claim 6, further comprising a conductive layer formed on the upper surface and a side surface of the base substrate and having electrical conductivity.

10. A method of manufacturing a semiconductor package including a quasi-coaxial transmission line comprising:

forming at least one cavity surrounding one pole or two or more poles, which are spaced apart from each other, and at least one reception portion, in a first surface of a base substrate;

forming a conductive layer made of a material having electrical conductivity on the first surface of the base substrate;

mounting a semiconductor chip in the at least one reception portion;

forming an insulation layer configured to cover the base substrate and the semiconductor chip, and forming a wiring layer, configured to form an electrode pattern for transmission of an electrical signal, on an insulation layer;

removing the conductive layer formed on a lower surface of the cavity while removing a portion of a second surface of the base substrate to separate the conductive layer formed on the pole from the conductive layer formed on an inner side surface of the cavity, thereby providing a core and a shield, which are separated from each other; and cutting the base substrate between the core and the cavity or between the two or more poles, which are spaced apart from each other, to remove at least a portion of the shield, thereby providing an open portion.

* * * * *